(12) United States Patent
Park et al.

(10) Patent No.: US 8,149,890 B2
(45) Date of Patent: Apr. 3, 2012

(54) MULTIPLE DISTRIBUTED FEEDBACK LASER DEVICES

(75) Inventors: Kyung Hyun Park, Daejeon (KR); Namje Kim, Daejeon (KR); Young Ahn Leem, Daejeon (KR); Sang-Pil Han, Daejeon (KR); Hyunsung Ko, Seoul (KR); Chul-Wook Lee, Daejeon (KR); Dong-Hun Lee, Daejeon (KR); Jaeheon Shin, Daejeon (KR); Eundeok Sim, Daejeon (KR); Yongsoon Baek, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/980,907

(22) Filed: Dec. 29, 2010

(65) Prior Publication Data

US 2011/0090932 A1    Apr. 21, 2011

Related U.S. Application Data

(63) Continuation-in-part of application No. 12/506,073, filed on Jul. 20, 2009, now Pat. No. 7,864,824.

(30) Foreign Application Priority Data

Dec. 4, 2008  (KR) .......................... 10-2008-0122673
Mar. 27, 2009  (KR) .......................... 10-2009-0026258
Dec. 9, 2010  (KR) .......................... 10-2010-0125778

(51) Int. Cl.
*H01S 5/00* (2006.01)
(52) U.S. Cl. ...................... 372/50.11; 372/34
(58) Field of Classification Search .............. 372/46.01, 372/46.015, 50.11, 34; 359/237
See application file for complete search history.

(56) References Cited

U.S. PATENT DOCUMENTS

| 5,536,085 A | 7/1996 | Li et al. |
| 6,233,082 B1 * | 5/2001 | Johnson .................. 359/237 |
| 6,349,156 B1 | 2/2002 | O'Brien et al. |

(Continued)

FOREIGN PATENT DOCUMENTS

KR    10-0526999    11/2005

(Continued)

OTHER PUBLICATIONS

S. Iio at al. "Two-Longitudinal-Mode Laser Diodes", IEEE Photonics Technology Letters, vol. 7, No. 9, Sep. 1995, pp. 959-961.

*Primary Examiner* — Jessica Stultz
*Assistant Examiner* — Tuan Nguyen
(74) *Attorney, Agent, or Firm* — Rabin & Berdo, P.C.

(57) ABSTRACT

Provided is a multiple distributed feedback laser device which includes a first distributed feedback region, a modulation region, a second distributed feedback region, and an amplification region. An active layer is disposed on the substrate of the first distributed feedback region, the modulation region, the second distributed feedback region, and the amplification region. A first diffraction grating is disposed in the first distributed feedback region to be coupled to the active layer in the first distributed feedback region. A second diffraction grating is disposed in the second distributed feedback region to be coupled to the active layer in the second distributed feedback region. The multiple distributed feedback laser device further includes a first micro heater configured to supply heat to the first diffraction grating and a second micro heater configured to supply heat to the second diffraction grating.

20 Claims, 23 Drawing Sheets

U.S. PATENT DOCUMENTS

| | | |
|---|---|---|
| 7,480,317 B2 | 1/2009 | Hu et al. |
| 7,489,838 B2 | 2/2009 | Kish, Jr. et al. |
| 7,620,078 B2 * | 11/2009 | Mori ................................ 372/20 |
| 2005/0242287 A1 | 11/2005 | Hakimi |
| 2010/0142571 A1 | 6/2010 | Park et al. |

FOREIGN PATENT DOCUMENTS

| | | |
|---|---|---|
| KR | 10-0799782 | 1/2008 |
| KR | 10-0900320 | 5/2009 |
| KR | 10-2010-0064280 A | 6/2010 |

* cited by examiner

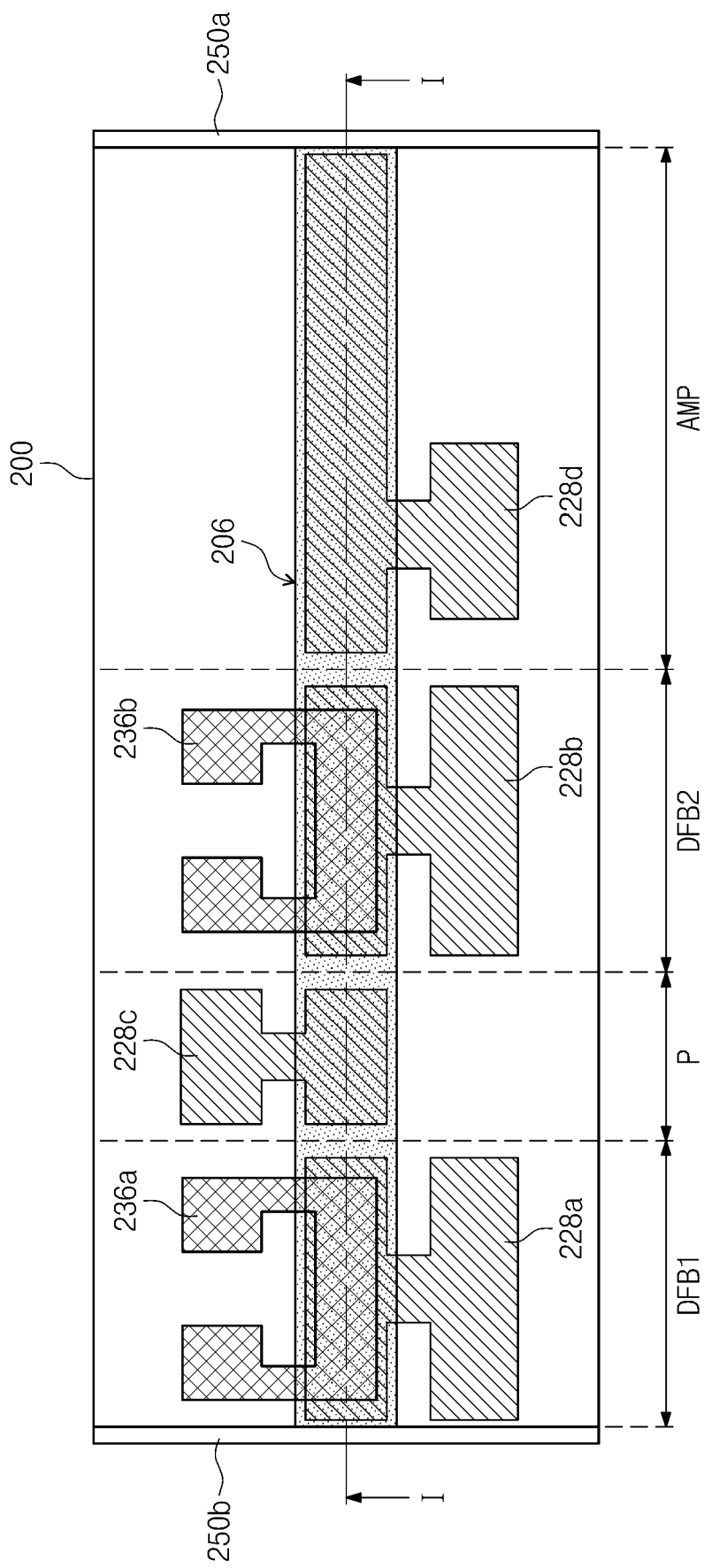

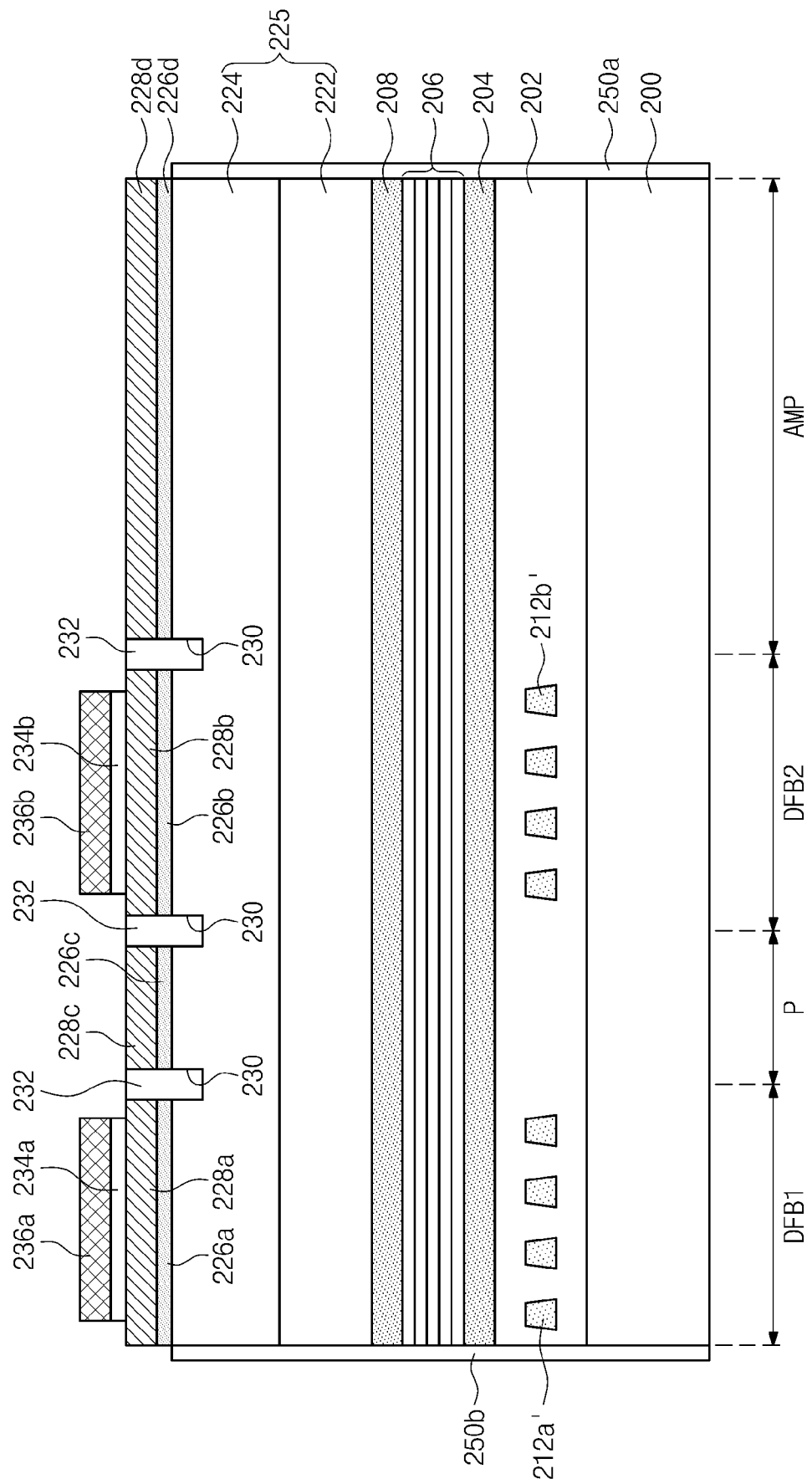

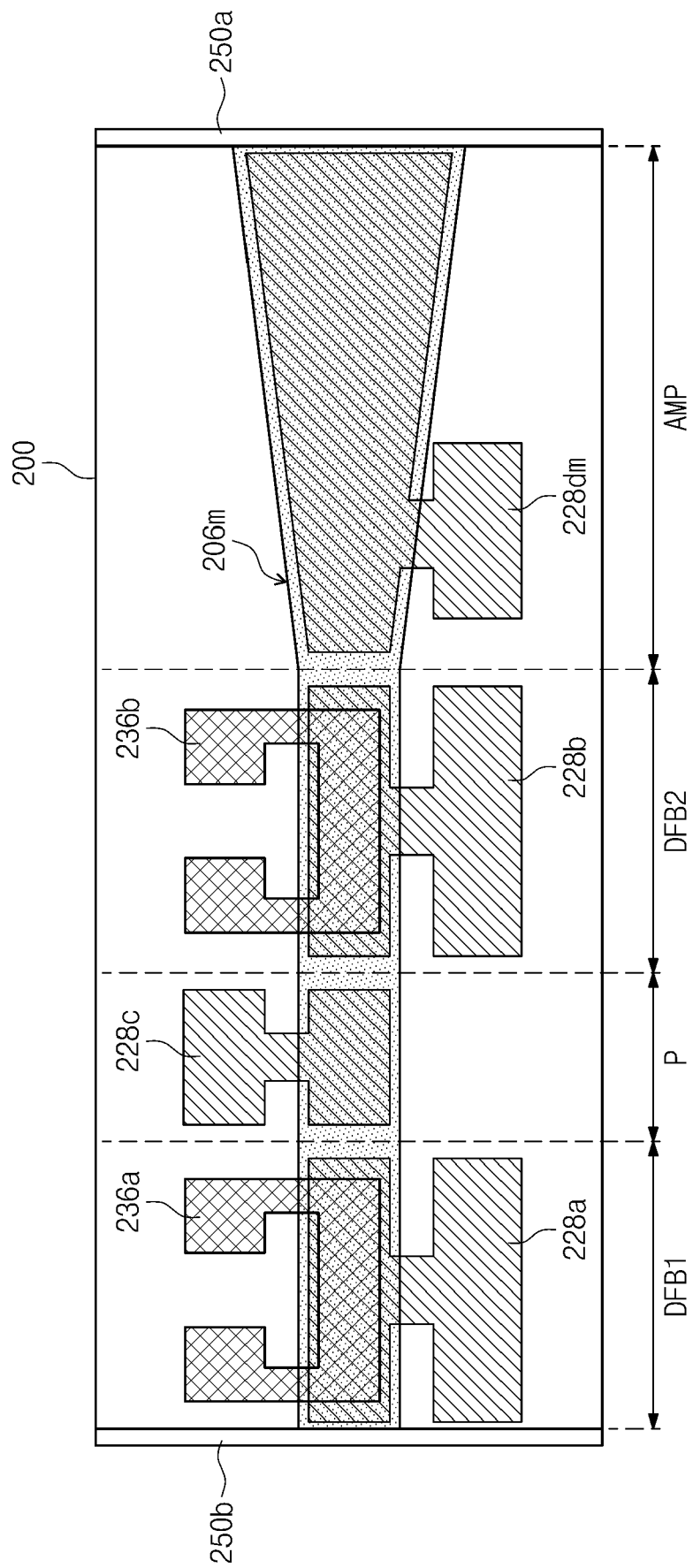

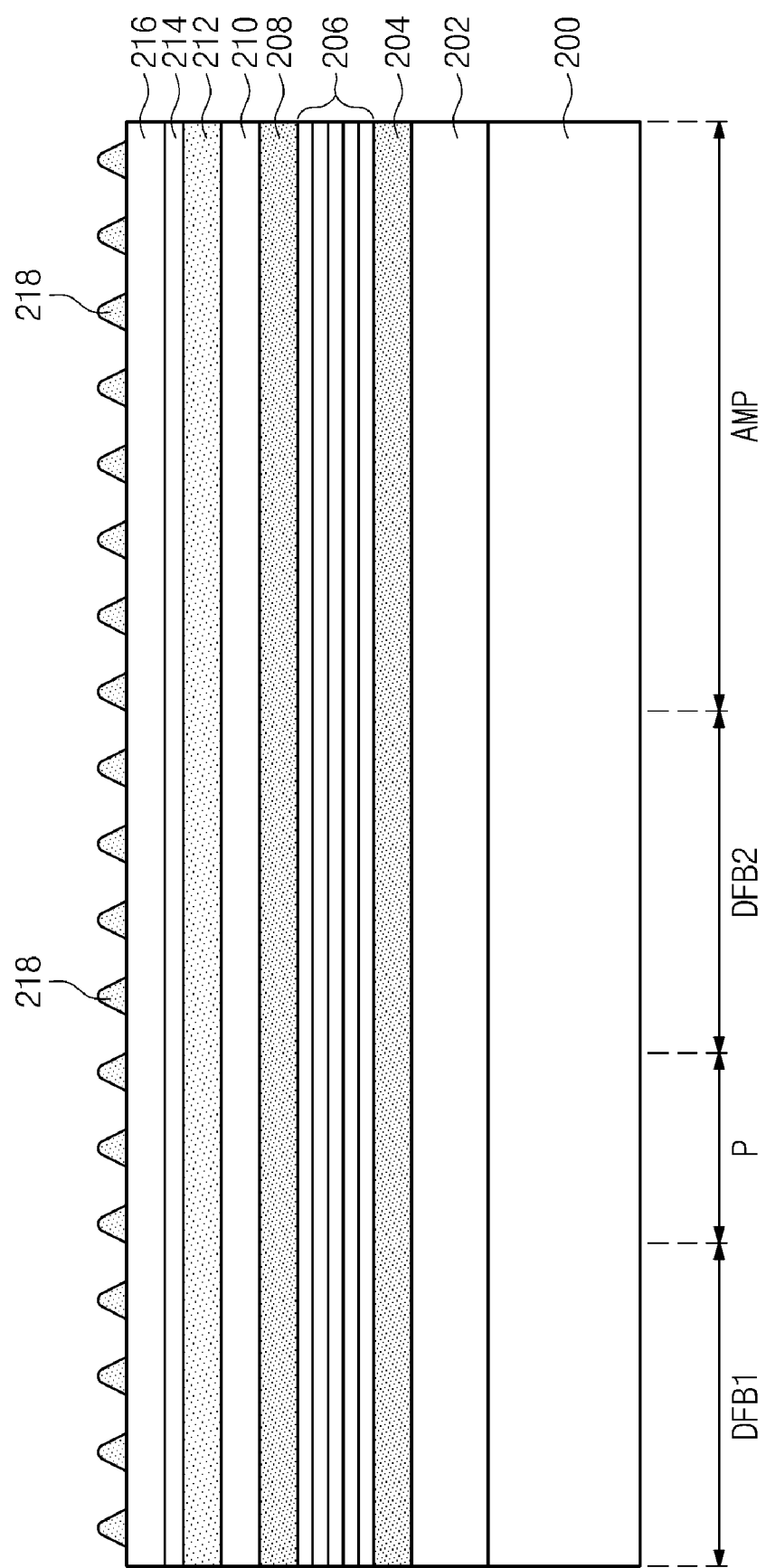

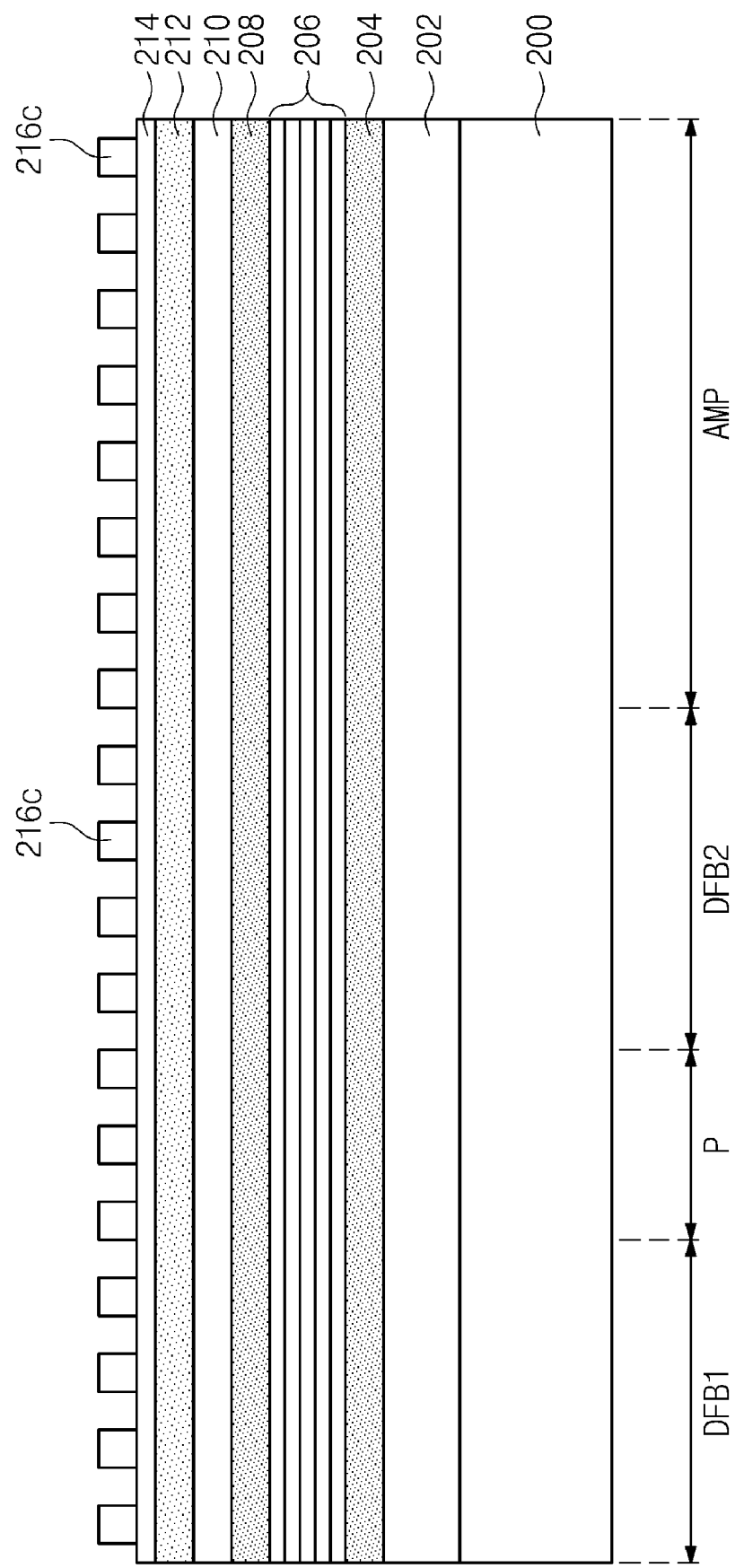

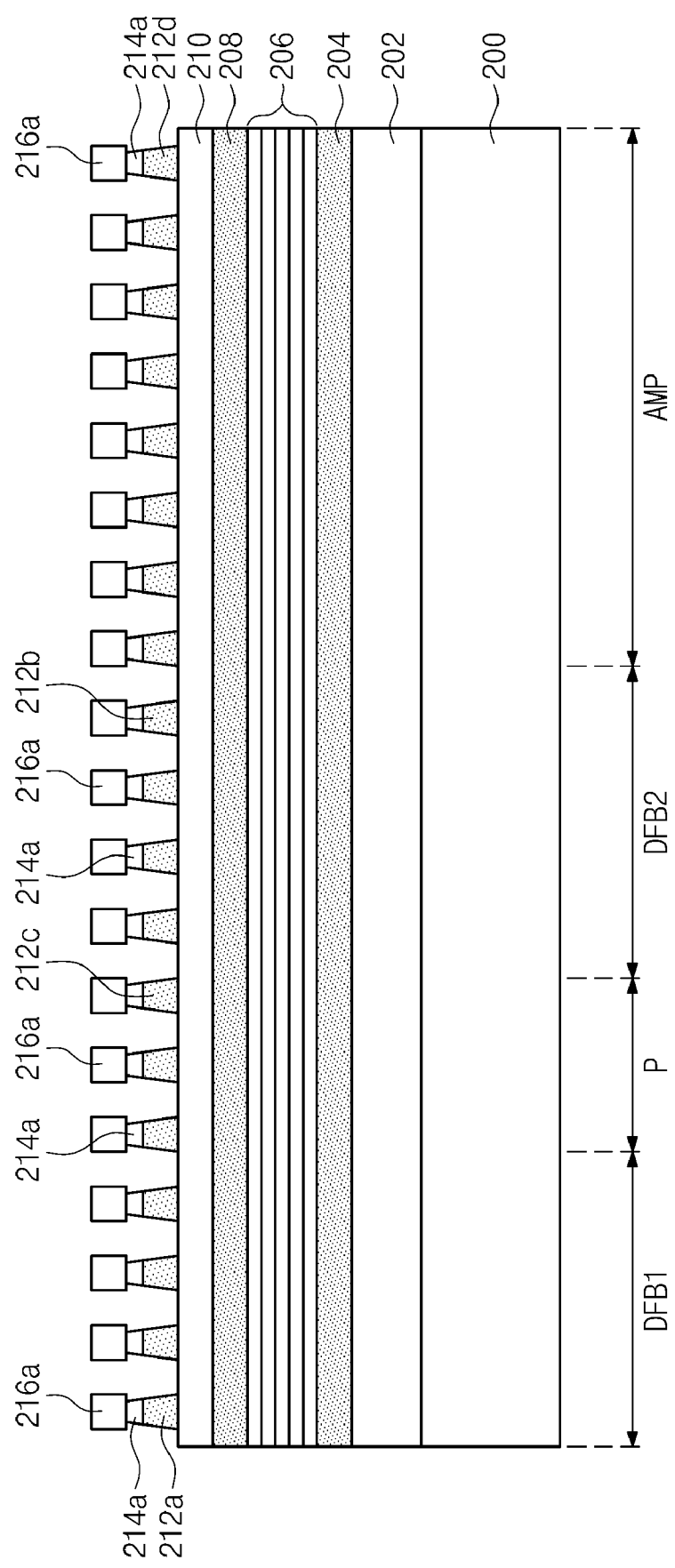

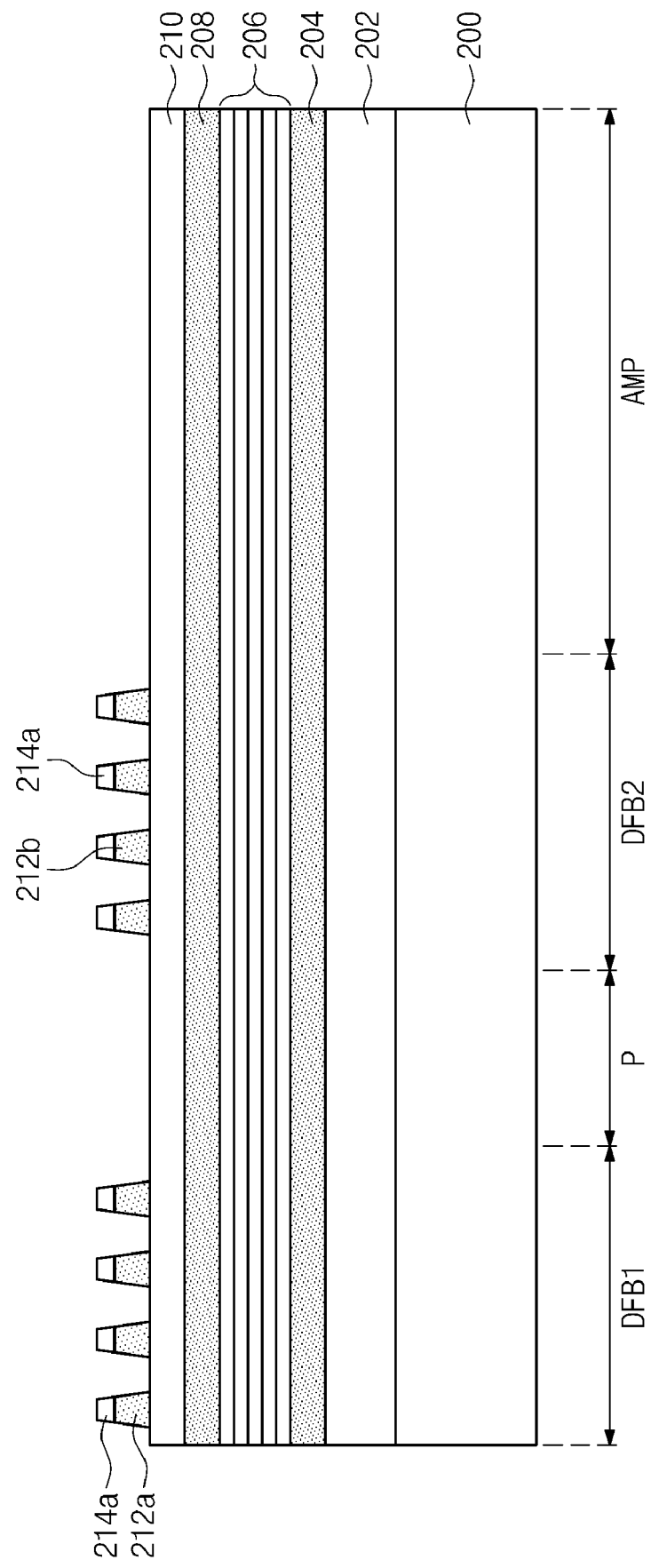

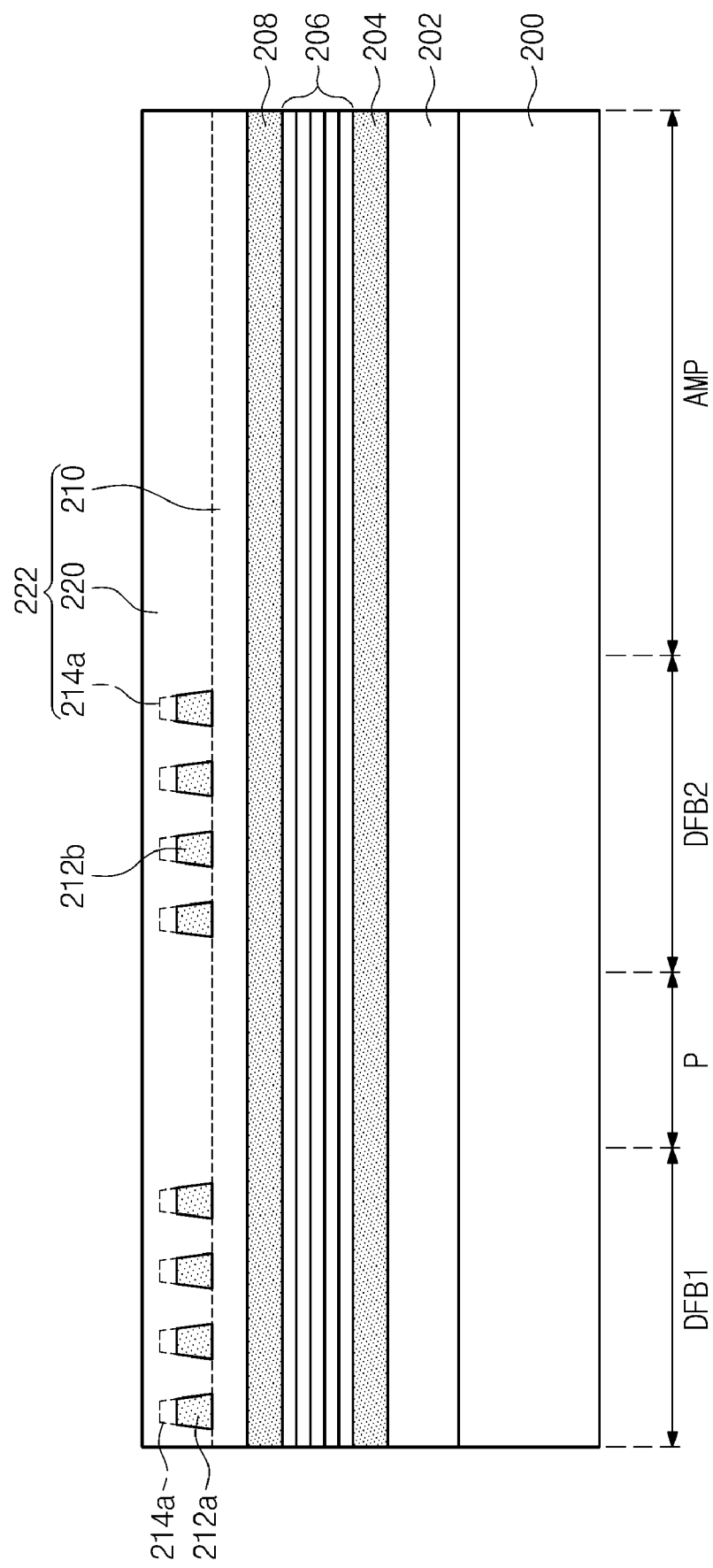

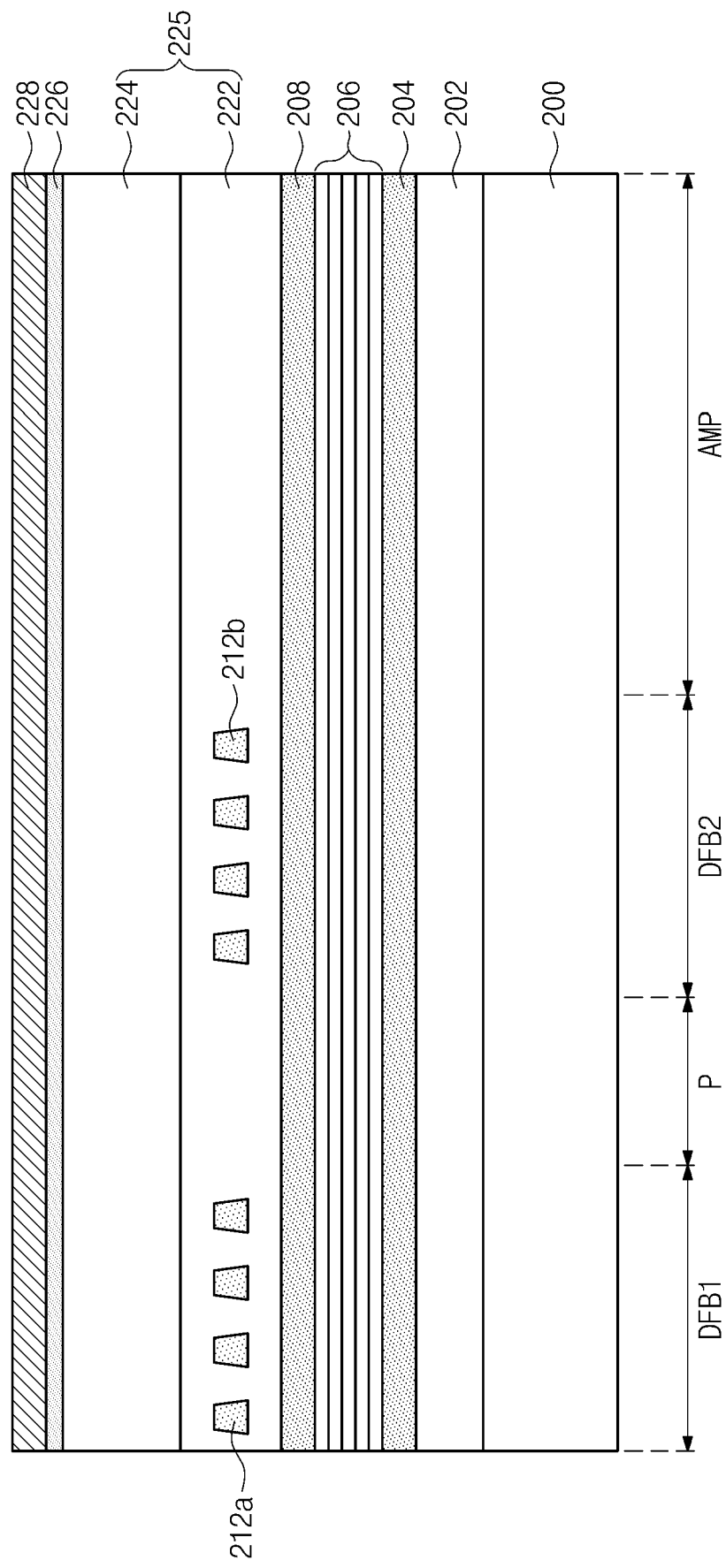

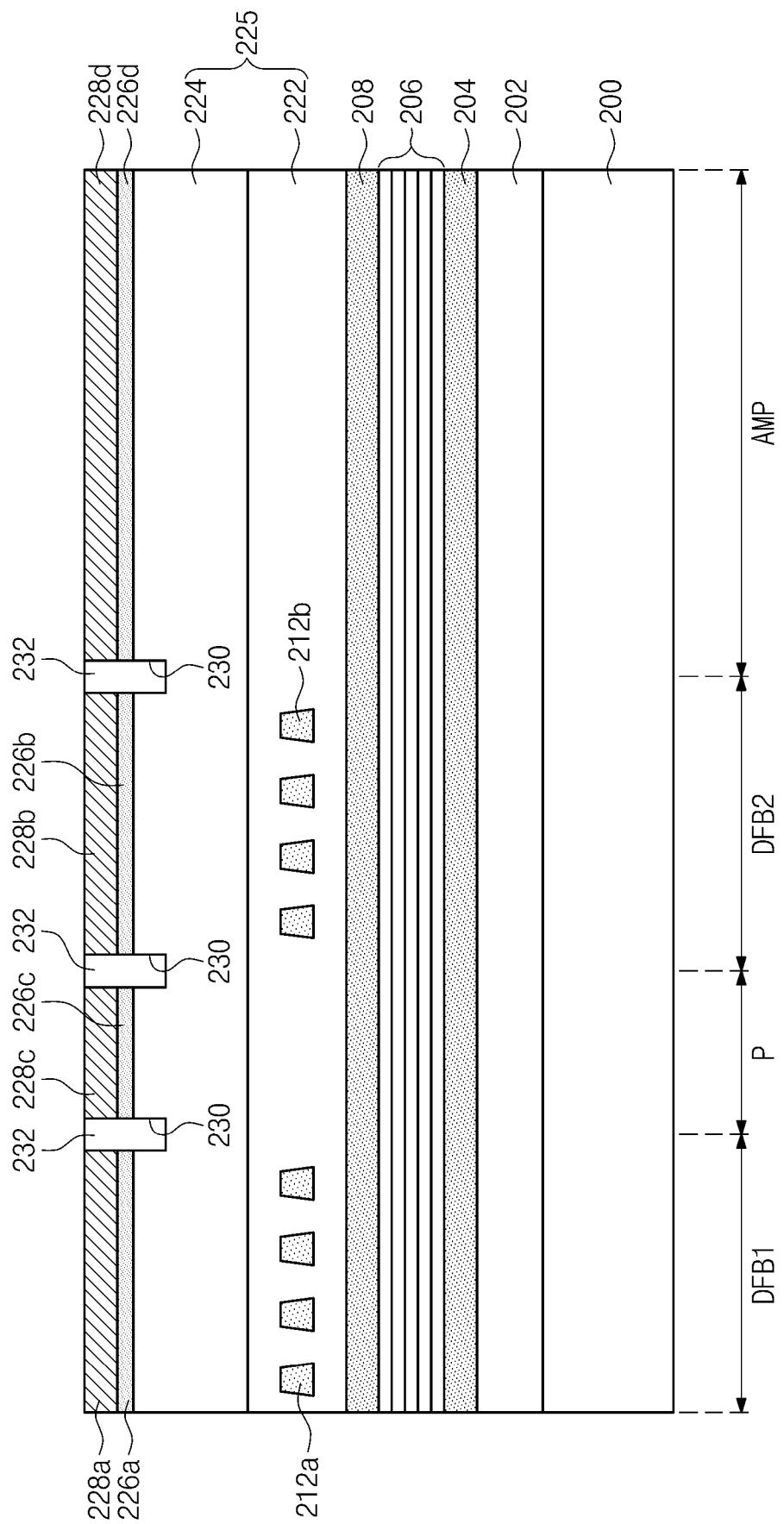

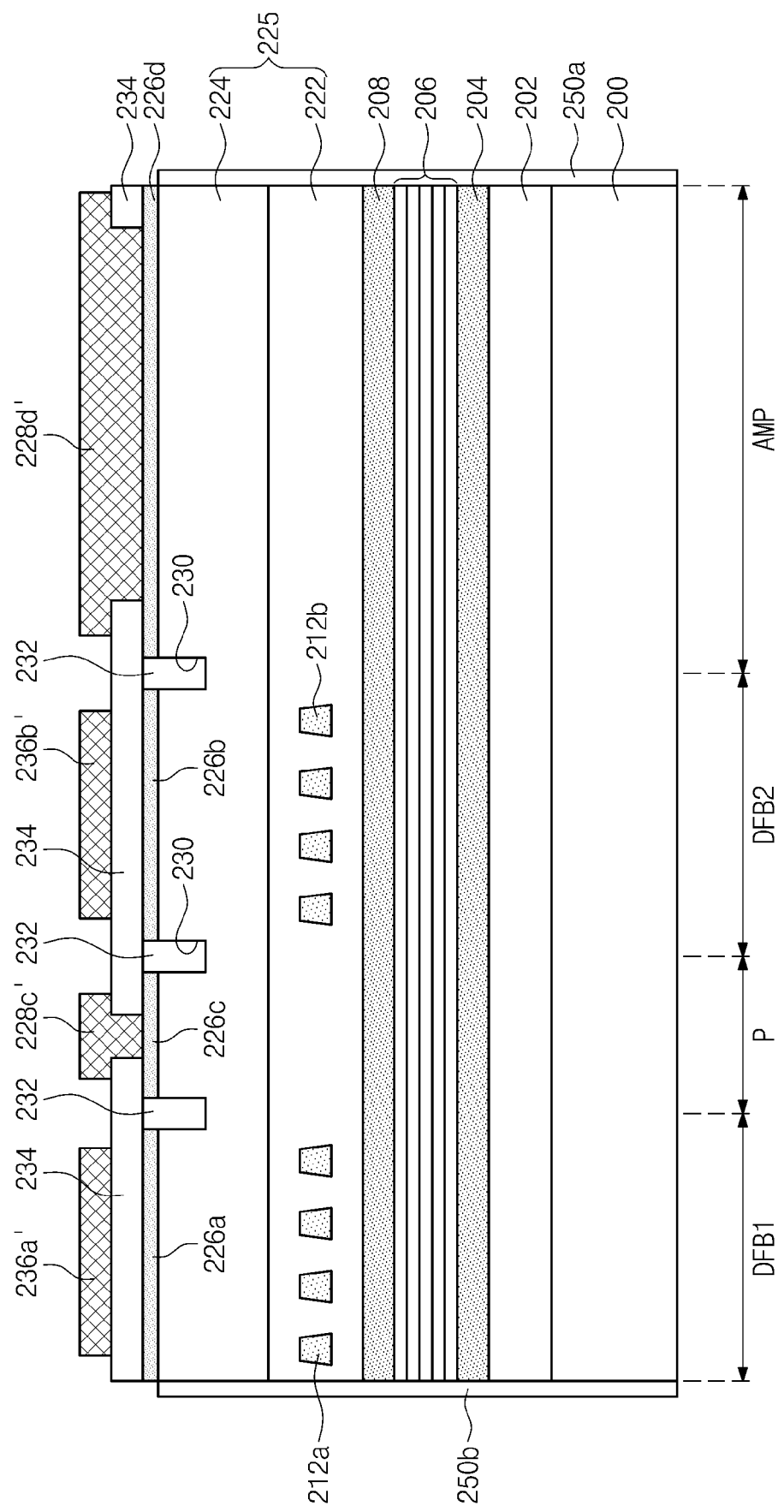

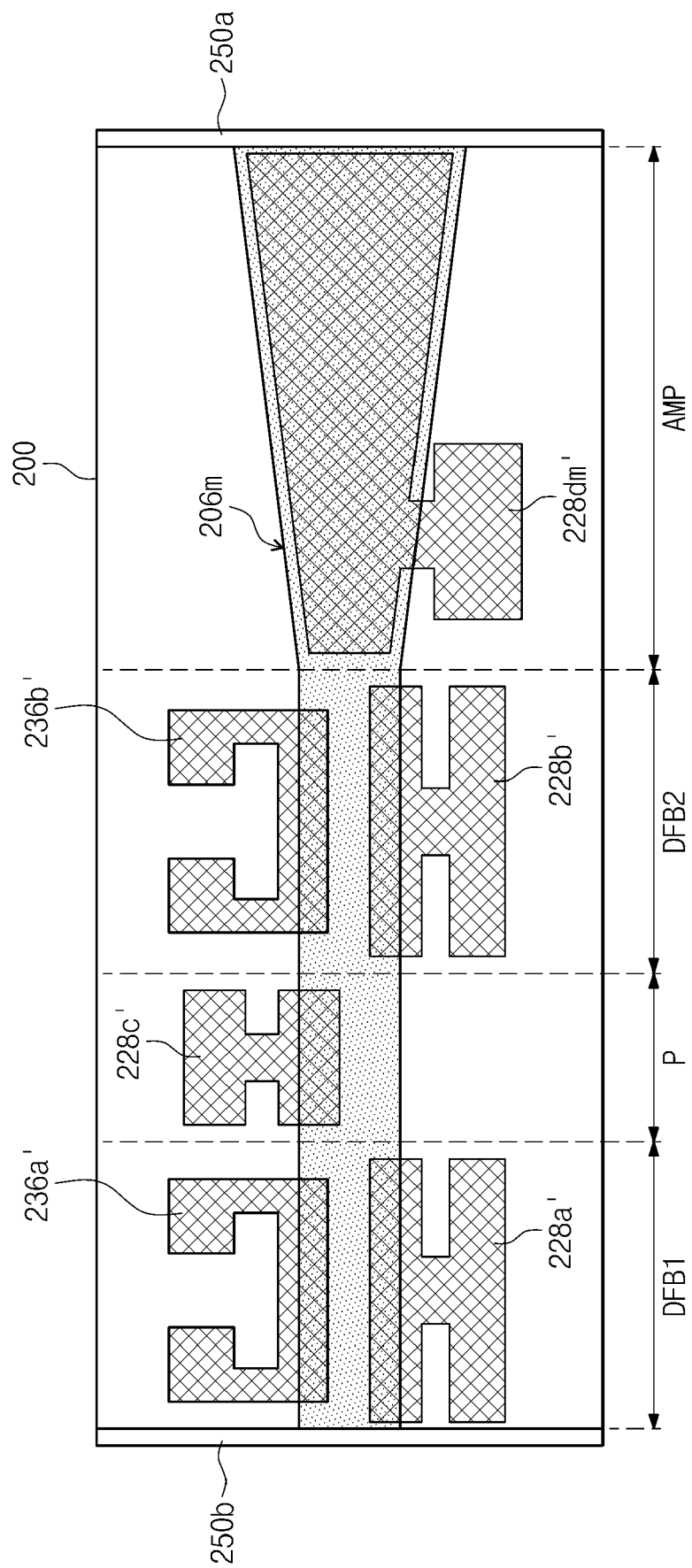

MULTIPLE DISTRIBUTED FEEDBACK LASER DEVICES

CROSS-REFERENCE TO RELATED APPLICATIONS

This application is a continuation-in-part application of U.S. application Ser. No. 12/506,073, filed Jul. 20, 2009 now U.S. Pat. No. 7,864,824, which claims priority under 35 U.S.C §119 to Korean Patent Application Nos. 10-2008-0122673, filed on Dec. 4, 2008, and 10-2009-0026258, filed on Mar. 27, 2009, the subject matter of which are hereby incorporated by reference. Also, this application claims priority under 35 U.S.C. §119 of Korean Patent Application No. 10-2010-0125778, filed on Dec. 9, 2010, the entire contents of which are hereby incorporated by reference.

BACKGROUND

The present invention disclosed herein relates to a laser device, and more particularly, to a multiple distributed feedback laser device.

Semiconductor-based optical devices may be manufactured using semiconductor processes such as a growth process, a photolithography process, and an etching process and/or a deposition process. By using the semiconductor processes, such a semiconductor-based optical device may be miniaturized and mass-produced. In addition, manufacturing costs thereof may be reduced. Accordingly, many researches with respect to the semiconductor-based optical device are being progressed.

Among the semiconductor-based optical devices, functional laser devices, which select specific wavelengths, such as a distributed feedback laser diode and/or a distributed bragg reflector laser diode are being developed. The functional laser devices may filter a wavelength using a diffraction grating. For example, only a lightwave having a specific wavelength corresponding to a bragg wavelength due to a periodic change of a refractive index may be reflected. Thus, the wavelength may be filtered. The reflected lightwave having the specific wavelength may be fed back into a gain region and oscillated. Such a functional laser device may be used as a light source for an optical communication system as well as a light source for generating a terahertz (THz) wave by photomixing.

In a method of generating the THz wave, there are various techniques such as a frequency doubling method, a backward wave oscillator, a photomixing method, carbon dioxide pumping gas laser, quantum cascade laser, and free electron laser. The photomixing method is a method in which beating signals of two laser diodes having wavelengths different from each other are incident onto a photomixer to secure a THz wave of a wavelength corresponding to a beating period thereof. To perform the photomixing method, a frequency of at least one of two laser beams must be stably sequentially tuned. Also, it may be required to accord characteristics of the two laser beams. To secure such a requirement, auxiliary devices are required. Thus, an apparatus of generating the THz wave using the photomixing method may become bigger, and a structure thereof may be complicated. Therefore, manufacturing costs may increase.

SUMMARY OF THE INVENTION

The present invention provides a multiple distributed feedback laser device having superior reliability.

The present invention also provides a highly integrated multiple distributed feedback laser device.

The present invention also provides a multiple distributed feedback laser device which can improve generation efficiency of a terahertz (THz) wave.

The present invention also provides a multiple distributed feedback laser device which can oscillate high-power.

In some embodiments, a multiple distributed feedback laser device may include a substrate including a first distributed feedback region, a modulation region, and a second distributed feedback region; an active layer on the substrate in the first distributed feedback, the modulation and the second distributed feedback regions; a first diffraction grating disposed in the first distributed feedback region and coupled to the active layer in the first distributed feedback region; a second diffraction grating disposed in the second distributed feedback region and coupled to the active layer in the second distributed feedback region; a first micro heater supplying heat to the first diffraction grating; and a second micro heater supplying heat to the second diffraction grating. The first micro heater and the second micro heater are controlled independently from each other.

In other embodiments, a refractive index of the first diffraction grating may be changed by the heat supplied from the first micro heater, and a refractive index of the second diffraction grating may be changed by the heat supplied from the second micro heater.

In still other embodiments, a temperature of the heat supplied from the first micro heater to the first diffraction grating may be different from that of the heat supplied from the second micro heater to the second diffraction grating.

In even other embodiments, the multiple distributed feedback laser devices may further include a lower cladding layer between the active layer and the substrate; and an upper cladding layer on the active layer, wherein the lower cladding layer may comprise a compound semiconductor doped with a first-type dopant, and at least upper portion of the upper cladding layer may comprise a compound semiconductor doped with a second-type dopant.

In yet other embodiments, a first laser current may be supplied to the active layer in the first distributed feedback region to oscillate a first light source having a first wavelength, and a second laser current may be supplied to the active layer in the second distributed feedback region to oscillate a second light source having a second wavelength. A reverse bias may be applied to the upper cladding layer, the active layer, and the lower cladding layer in the modulation region to cause an electro absorption phenomenon within the modulation region.

In further embodiments, the first and second diffraction gratings may be disposed in the upper cladding layer.

In still further embodiments, the multiple distributed feedback laser devices may further include a first separate confinement hetero layer between the lower cladding layer and the active layer, the first separate confinement hetero layer having a band gap wavelength less than that of the active layer; and a second separate confinement hetero layer between the upper cladding layer and the active layer, the second separate confinement hetero layer having a band gap wavelength less than that of the active layer.

In even further embodiments, the first micro heater may be disposed over the upper cladding layer of the first distributed feedback region, and the second micro heater may be disposed over the upper cladding layer of the second distributed feedback region. The first and second micro heaters may be electrically insulated from the upper cladding layer.

In yet further embodiments, the multiple distributed feedback laser devices may further include a first electrode electrically connected to the upper cladding layer in the first distributed feedback region; a second electrode electrically connected to the upper cladding layer in the second distributed feedback region; a third electrode electrically connected to the upper cladding layer in the modulation region; a first interlayer dielectric pattern between the first electrode and the first micro heater; and a second interlayer dielectric pattern between the second electrode and the second micro heater.

In yet further embodiments, at least one of the first diffraction grating and the second diffraction grating may include a complex coupled diffraction grating.

In yet further embodiments, the active layer may have a multiple quantum well structure.

In yet further embodiments, the first diffraction grating may have the same period as the second diffraction grating.

In yet further embodiments, the first diffraction grating may have a period different from that of the second diffraction grating.

In yet further embodiments, the first and second diffraction gratings may include compound semiconductors doped with an n-type or p-type dopant, respectively.

In some embodiments, the multiple distributed feedback laser device may include: a substrate including a first distributed feedback region, a modulation region, a second distributed feedback region, and an amplification region; an active layer continuously disposed on the substrate of the first distributed feedback region, the modulation region, the second distributed feedback region, and the amplification region; a first diffraction grating disposed in the first distributed feedback region and coupled to the active layer in the first distributed feedback region; a second diffraction grating disposed in the second distributed feedback region and coupled to the active layer in the second distributed feedback region; a first micro heater configured to supply heat to the first diffraction grating; and a second micro heater configured to supply heat to the second diffraction grating.

According to an example embodiment, the multiple distributed feedback laser device may further include a lower cladding layer disposed between the active layer and the substrate; and an upper cladding layer disposed on the active layer. The lower cladding layer may include a compound semiconductor doped with a first-type dopant, and the upper cladding layer may include a compound semiconductor doped with a second-type dopant.

According to an example embodiment, first laser current may be supplied to the active layer in the first distributed feedback region to oscillate a first light source having a first wavelength. Second laser current may be supplied to the active layer in the second distributed feedback region to oscillate a second light source having a second wavelength. A reverse bias may be applied to the upper cladding layer, the active layer, and the lower cladding layer in the modulation region to cause an electroabsorption phenomenon within the modulation region. Amplification current may be supplied to the active layer in the amplification region to amplify the first and second light sources supplied into the amplification region.

According to an example embodiment, the multiple distributed feedback laser device may further include: a first electrode electrically connected to the upper cladding layer in the first distributed feedback region; a second electrode electrically connected to the upper cladding layer in the second distributed feedback region; a third electrode electrically connected to the upper cladding layer in the modulation region; and a fourth electrode electrically connected to the upper cladding layer in the amplification region.

According to an example embodiment, the first and second micro heaters may be disposed over the upper cladding layer. Also the first and second micro heaters may be electrically insulated from the upper cladding layer.

According to an example embodiment, the first micro heater may overlap the first electrode and the second micro heater overlaps the second electrode. In this case, the multiple distributed feedback laser device may further include a first interlayer dielectric pattern disposed between the first electrode and the first micro heater; and a second interlayer dielectric pattern disposed between the second electrode and the second micro heater.

According to an example embodiment, the first electrode may overlap a portion of the active layer in the first distributed feedback region and the first micro heater may overlap another portion of the active layer in the first distributed feedback region. The second electrode may overlap a portion of the active layer in the second distributed feedback region and the second micro heater may overlap another portion of the active layer in the second distributed feedback region. In this case, the first and second micro heaters may be disposed at the same level as at least a portion of the first and second electrodes, on the basis of a top surface of the substrate.

According to an example embodiment, the first diffraction grating may be disposed inside one of the upper and lower cladding layers in the first distributed feedback region, and the second diffraction grating may be disposed inside one of the upper and lower cladding layers in the second distributed feedback region.

According to an example embodiment, the multiple distributed feedback laser device may further include: a first separate hetero layer disposed between the lower cladding layer and the active layer and having a band gap wavelength less than that of the active layer; and a second separate hetero layer disposed between the upper cladding layer and the active layer and having a band gap wavelength less than that of the active layer.

According to an example embodiment, the active layer in the amplification region may have a uniform width, when viewed from the top.

According to an example embodiment, the active layer in the amplification region may have a taper shape, when viewed from the top.

According to an example embodiment, the first micro heater and the second micro heater may be independently controlled.

According to an example embodiment, a refractive index of the first diffraction grating may be changed by heat that the first micro heater supplies, and a refractive index of the second diffraction grating may be changed by heat that the second micro heater supplies.

According to an example embodiment, a temperature of the heat that the first micro heater supplies the first diffraction grating may be different from a temperature of the heat that the second diffraction grating supplies the second diffraction grating.

According to an example embodiment, at least one of the first and second diffraction gratings may be a loss-coupled diffraction grating, a gain-coupled diffraction grating, an index coupled diffraction grating or a complex coupled diffraction grating.

According to an example embodiment, the period of the first diffraction grating may be equal to that of the second diffraction grating.

According to an example embodiment, the period of the first diffraction grating may be different from that of the second diffraction grating.

According to an example embodiment, the active layer may be formed to have a multiple quantum well structure.

According to an example embodiment, the first and second diffraction gratings may include a compound semiconductor doped with an n-type or p-type dopant.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIG. 3A is a top plan view of a multiple distributed feedback laser device according to another embodiment of the present invention;

FIG. 4A is a cross-sectional view, taken along the line I-I' in FIG. 3A, illustrating a modified embodiment of the multiple distributed feedback laser device according to another embodiment of the present invention;

FIG. 4C is a top plan view illustrating yet another modified embodiment of the multiple distributed feedback laser device according to another embodiment of the present invention;

FIGS. 5A to 5H are cross-sectional views, taken along the line I-I' in FIG. 3A, illustrating a method for fabricating the multiple distributed feedback laser device according to another embodiment of the present invention;

FIG. 6B is a cross-sectional view taken along the line II-II' in FIG. 6A;

FIG. 7 is a cross-sectional view illustrating a modified embodiment of the multiple distributed feedback laser device according to yet another embodiment of the present invention.

DETAILED DESCRIPTION OF PREFERRED EMBODIMENTS

Figure 1:
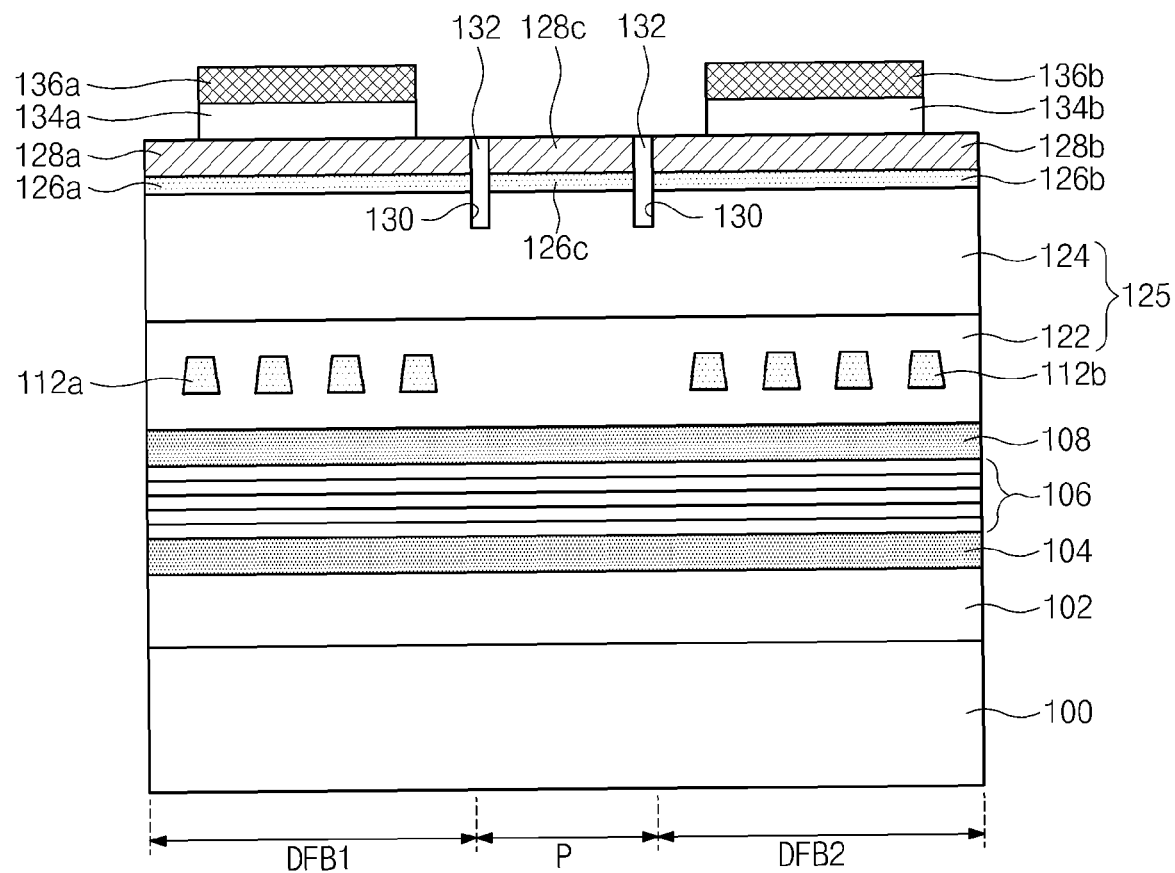
FIG. 1 is a cross-sectional view of a multiple distributed feedback laser device according to an embodiment of the present invention.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout. As used herein, the term "and/or" includes any and all combinations of one or more of the associated listed items.

Embodiment 1

FIG. 1 is a cross-sectional view of a multiple distributed feedback laser device according to an embodiment of the present invention.

Referring to FIG. 1, a substrate 100 includes a first distributed feedback region DFB1, a modulation region P and a second distributed feedback region DFB2. An active layer 106 is disposed on the substrate 100. The active layer 106 is disposed in the first distributed feedback, modulation, and second distributed feedback regions DFB1, P, and DFB2 of the substrate 100. The modulation region P may be disposed between the first distributed feedback region DFB1 and the second distributed feedback region DFB2. The substrate 100 may be formed of a compound semiconductor. For example, the substrate 100 may include an indium-phosphorus (InP) substrate.

The active layer 106 may be continuously disposed along the first distributed feedback, modulation, and second distributed feedback regions DFB1, P, and DFB2 of the substrate 100. The active layer 106 may be formed of a compound semiconductor. The active layer 106 may have a multiple quantum well structure. For example, a first InGaAsP layer (well) and a second InGaAsP layer (barrier), which have band gaps different from each other, may be alternately stacked to form the active layer 106.

According to an embodiment of the present invention, the active layer 106 may have a bulk shape formed of InGaAsP having a band gap wavelength of about 1.55 µm. The active layer 106 may be in an intrinsic state.

A lower cladding layer 102 may be disposed between the active layer 106 and the substrate 100. The lower cladding layer 102 may be formed of a compound semiconductor doped with a first-type dopant. An upper cladding layer 125 may be disposed on the active layer 106. At least upper portion of the upper cladding layer 125 may be formed of a compound semiconductor doped with a second-type dopant. One of the first-type dopant and the second-type dopant is an n-type dopant, and the other is a p-type dopant. For example, the lower cladding layer 102 may be formed of n-type InP, and the upper cladding layer 125 may be formed of p-type InP. On the other hand, the lower cladding layer 102 may be formed of the p-type InP, and the upper cladding layer 125 may be formed of the n-type InP. For convenience of description in this embodiment, a case in which the lower cladding layer 102 is formed of the n-type InP, and the upper cladding layer 125 is formed of the p-type InP will be described below.

A first separate confinement hetero layer 104 may be disposed between the active layer 106 and the lower cladding layer 102. The first separate confinement hetero layer 104 may be formed of a compound semiconductor having a band gap wavelength less than that of the active layer 106. For example, the first separate confinement hetero layer 104 may be formed of InGaAsP having a band gap wavelength of about 1.3 μm. A second separate confinement hetero layer 108 may be disposed between the active layer 106 and the upper cladding layer 125. The second separate confinement hetero layer 108 may be formed of a compound semiconductor having a band gap wavelength less than that of the active layer 106. For example, the second separate confinement hetero layer 108 may be formed of InGaAsP having a band gap wavelength of about 1.3 μm. Each of the first and second separate confinement hetero layers 104 and 108 may have a thickness of about 0.1 μm. However, the present invention is not limited thereto. The first and second separate confinement hetero layers 104 and 108 may have thicknesses different from each other. The first and second separate confinement hetero layers 104 and 108 may be in intrinsic states, respectively.

A first diffraction grating 112a is disposed in the first distributed feedback region DFB1, and a second diffraction grating 112b is disposed in the second distributed feedback region DFB2. A diffraction grating is not disposed in the modulation region P. The first diffraction grating 112a is coupled to the active layer 106 within the first distributed feedback region DFB1, and the second diffraction grating 112b is coupled to the active layer 106 within the second distributed feedback region DFB2. Light emitted from the active layer 106 within the first distributed feedback region DFB1 may be bragg-reflected by the first diffraction grating 112a to oscillate a first light source having a first wavelength. Light emitted from the active layer 106 within the second distributed feedback region DFB2 may be bragg-reflected by the second diffraction grating 112b to oscillate a second light source having a second wavelength.

The first diffraction grating 112a may be disposed within the upper cladding layer 125 in the first distributed feedback region DFB1, and the second diffraction grating 112b may be disposed within the upper cladding layer 125 in the second distributed feedback region DFB2. In detail, the upper cladding layer 125 may include a first upper cladding layer 122 and a second cladding layer 124, which are sequentially stacked. In this case, the first diffraction grating 112a may be disposed within the first upper cladding layer 122 in the first distributed feedback region DFB1, and the second diffraction grating 112b may be disposed within the first upper cladding layer 122 in the second distributed feedback region DFB2. The second upper cladding layer 124 may be formed of a compound semiconductor doped with the second-type dopant. For example, in case where the lower cladding layer 102 is formed of the n-type InP, the second upper cladding layer 124 may be formed of the p-type InP. The first upper cladding layer 122 surrounding the diffraction gratings 112a and 112b may be formed of an undoped compound semiconductor (for example, undoped InP, etc.). On the other hand, the first upper cladding layer 122 may be formed of a compound semiconductor doped with the second-type dopant (for example, p-type InP, etc.).

The first diffraction grating 112a may have the same period as that of the second diffraction grating 112b. On the other hand, according to an embodiment of the present invention, the first and second diffraction gratings 112a and 112b may have periods different from each other. In addition, shapes of the first and second diffraction gratings 112a and 112b may be equal to or different from each other.

At least one of the first and second diffraction gratings 112a and 112b may include a complex coupled diffraction grating. The first and second diffraction gratings 112a and 112b may be formed of compound semiconductors for complex coupling, respectively. For example, the first and second diffraction gratings 112a and 112b may be formed of InGaAs. The first and second diffraction gratings 112a and 112b may be doped with the n-type dopant or the p-type dopant. However, the present invention is not limited thereto. At least one of the first and second diffraction gratings 112a and 112b may include an index coupled diffraction grating.

A first electrode 128a is electrically connected to the upper cladding layer 125 in the first distributed feedback region DFB1, and a second electrode 128b is electrically connected to the upper cladding layer 125 in the second distributed feedback region DFB2. A third electrode 128c is electrically connected to the upper cladding layer 125 in the modulation region P. The first, second, and third electrodes 128a, 128b, and 128c may be disposed on the upper cladding layer 125 in the first distributed feedback region DFB1, the second distributed feedback region DFB2, and the modulation region P, respectively. The first, second, and third electrodes 128a, 128b, and 128c are spaced from each other by isolation trenches 130. The first, second, and third electrodes 128a, 128b, and 128c may be formed of a metallic material. Isolation-insulation patterns 132 may be disposed in the isolation trenches 130, respectively. That is, the isolation-insulation patterns 132 may be disposed among the first, second, and third electrodes 128a, 128b, and 128c, respectively. The isolation-insulation patterns 132 may be formed of at least one of oxide, nitride, and oxide-nitride the isolation trench 130 may extend downwardly into an upper portion of the upper cladding layer 125. That is, a bottom surface of the isolation trench 130 may be lower than a top surface of the upper cladding layer 125. Components (e.g., diodes) in the first distributed feedback, modulation, and second distributed feedback regions DFB1, P, and DFB2 may operate independently from each other due to the isolation trenches 130. The isolation trench 130 may have a depth at which the components in the regions DFB1, P, and DFB2 are independently operable. Also, the isolation trench 130 may have a depth at which the oscillated lightwave having the specific wavelength can be minimally coupled. That is, the depth of the isolation trench 130 may be defined in consideration of the independent operations of the components within the regions DFB1, P, and DFB2 and the minimal coupling of the oscillated lightwave.

A first ohmic pattern 126a may be disposed between the first electrode 128a and the upper cladding layer 120 in the first distributed feedback region DFB1. A second ohmic pattern 126b may be disposed between the second electrode 128b and the upper cladding layer 120 in the second distributed feedback region DFB2. A third ohmic pattern 126c may be disposed between the third electrode 128c and the upper cladding layer 120 in the modulation region P. The first, second, and third ohmic patterns 126a, 126b, and 126c may be separated from each other by the isolation-insulation patterns 132. The first, second, and third ohmic patterns 126a, 126b, and 126c may be formed of the same material. For example, the first, second, and third ohmic patterns 126a, 126b, and 126c may be formed of InGaAs.

A first micro heater 136a for supplying heat to the first diffraction grating 112a is disposed in the first distributed feedback region DFB1, and a second micro heater 136b for supplying heat to the second diffraction grating 112b is disposed in the second distributed feedback region DFB2. The first micro heater 136a may be disposed over the upper cladding layer 125 in the first distributed feedback region DFB1. The first micro heater 136a may be electrically insulated from the upper cladding layer 125. The second micro heater 136b may be disposed over the upper cladding layer 125 in the second distributed feedback region DFB2. The second micro heater 136b may be electrically insulated from the upper cladding layer 125. The first and second micro heaters 136a and 136b are controlled independently from each other. A refractive index of the first diffraction grating 112a can be changed due to the heat supplied by the first micro heater 136a. A refractive index of the second diffraction grating 112b can be changed due to the heat supplied by the second micro heater 136b. A temperature of the heat supplied by the first micro heater 136a may be different from that of the heat supplied by the second micro heater 136b. At this time, one of the temperatures of the heat supplied by the first and second micro heaters 136a and 136b may be about 0° C. That is, the fact that the temperatures of the heat supplied by the first and second micro heaters 136a and 136b are different from each other may comprise that one micro heater of the first and second micro heaters 136a and 136b supplies heat having a predetermined temperature, and the other micro heater does not supply heat.

The first and second micro heaters 136a and 136b may supply the heat to the first and second diffraction gratings 112a and 112b using Joule's heat. The first and second micro heaters 136a and 136b may be formed of a material having electrical resistivity. For example, the first and second micro heaters 136a and 136b may be formed of a metal such as chrome (Cr) and gold (Au). According to an embodiment of the present invention, the Cr contained in the first and second micro heaters 136a and 136b may be used as a thermal resistor. According to an embodiment of the present invention, the Au contained in the first and second micro heaters 136a and 136b may be used as a bonding material and/or a thermal resistor. However, the present invention is not limited thereto. The first and second micro heaters 136a and 136b may be formed of different materials having electrical resistivity.

The first micro heater 136a may be disposed over the first electrode 128a. A first interlayer dielectric pattern 134a may be disposed between the first electrode 128a and the first micro heater 136a. The second micro heater 136b may be disposed over the second electrode 128b. A second interlayer dielectric pattern 134b may be disposed between the second electrode 128b and the second micro heater 136b. The first and second micro heaters 136a and 136b may be electrically insulated from the first and second electrodes 128a and 128b by the first and second interlayer dielectric patterns 134a and 134b, respectively. Thus, the first and second micro heaters 136a and 136b and the first and second electrodes 128a and 128b may be controlled independently from each other. The first and second interlayer dielectric patterns 134a and 134b may extend laterally to connect with each other. The first and second interlayer dielectric patterns 134a and 134b may be formed of at least one of oxide, nitride, and oxide-nitride.

A first distributed feedback laser diode may include the lower cladding layer 102, the first separate confinement hetero layer 104, the active layer 106, the second separate confinement hetero layer 108, the first diffraction grating 112a, and the upper cladding layer 125 in the first distributed feedback region DFB1. A second distributed feedback laser diode may include the lower cladding layer 102, the first separate confinement hetero layer 104, the active layer 106, the second separate confinement hetero layer 108, the second diffraction grating 112b, and the upper cladding layer 125 in the second distributed feedback region DFB2. A modulation diode may include the lower cladding layer 102, the first separate confinement hetero layer 104, the active layer 106, the second separate confinement hetero layer 108, and the upper cladding layer 125 in the modulation region P.

A first laser current may be supplied to the active layer 106 in the first distributed feedback laser diode through the first electrode 128a. The first laser current may be supplied to the first electrode 128a by applying a forward bias to the first distributed feedback laser diode. The first laser current may be applied to generate light in the active layer 106 in the first distributed feedback laser diode. The generated light is bragg-reflected by the first diffraction grating 112a to oscillate the first light source having the first wavelength. The first wavelength of the first light source may be changed by a change of a refractive index of the first diffraction grating 112a. For example, the first wavelength of the first light source may be in proportion to the refractive index of the first diffraction grating 112a. A first heater current may be supplied to the first micro heater 136a to supply heat of a first temperature to the first diffraction grating 112a, thereby changing the refractive index of the first diffraction grating 112a. Thus, the first wavelength of the first light source may be changed. That is, the first wavelength of the first light source may be changed by the first heater current supplied to the first micro heater 136a.

A second laser current may be supplied to the active layer 106 in the second distributed feedback laser diode through the second electrode 128b. The second laser current may be supplied to the second electrode 128b by applying a forward bias to the second distributed feedback laser diode. The second laser current may be applied to generate light in the active layer 106 in the second distributed feedback laser diode. The generated light in the second distributed feedback laser diode is bragg-reflected by the second diffraction grating 112b to oscillate the second light source having the second wavelength. The second wavelength of the second light source may be changed by a change of a refractive index of the second diffraction grating 112b. A second heater current may be supplied to the second micro heater 136b to supply heat of a second temperature to the second diffraction grating 112b, thereby changing the refractive index of the second diffraction grating 112b. Thus, the second wavelength of the second light source may be changed. That is, the second wavelength of the second light source may be changed by the second heater current supplied to the second micro heater 136b.

A reverse bias may be applied to the modulation diode through the third electrode 128c. As a result, an electro absorption phenomenon may occur in the modulation diode. Side modes except main oscillation modes of the first and second light sources may be absorbed by modulation diode. As a result, optical losses of the first and second light sources may be minimized The modulation region P in which the modulation diode is disposed may have a limited width (e.g., a distance between the first and second distributed feedback regions DFB1 and DFB2) to minimize optical losses. For example, the modulation region P may have a width less than about 50 μm.

An operation method of the above-described multiple distributed feedback laser device will now be described. The first and second laser currents are supplied to the first and second distributed feedback laser diodes through the first and second electrodes 128a and 128b, respectively. Thus, the first wavelength of the first light source and the second wavelength of the second light source are oscillated from the first and second distributed feedback laser diodes, respectively. At least one of the first and second micro heaters 136a and 136b may operate to change at least one of the first and second wavelengths of the first and second light sources. As a result, the first and second light source having wavelengths different from each other may be oscillated.

According to an embodiment of the present invention, the second heater current may be supplied to the second micro heater 136b without operating the first micro heater 136a. In this case, the second heater current may be continuously changed. Since the second heater current is changed, the temperature of the heat supplied by the second micro heater 136b may be changed. Also, since the temperature is changed, the refractive index of the second diffraction grating 112b may be changed. As a result, the second wavelength of the second light source is continuously stably changed. According to this embodiment, the multiple distributed feedback laser device may continuously oscillate the first light source having the fixed first wavelength and the second light source having the continuously changed second wavelength. The oscillated first and second light sources may be supplied to the photomixer via a resonator to generate a variable a terahertz (THz) wave.

According to another embodiment of the present invention, the first heater current may be supplied to the first micro heater 136a, and the second micro heater 136b may not operate. In this case, the first heater current may be continuously changed to continuously oscillate the first light source having the continuously changed first wavelength and the second light source having the fixed second wavelength.

According to another embodiment of the present invention, the first heater current may be supplied to the first micro heater 136a, and the second heater current may be supplied to the second micro heater 136b. At this time, the first heater current may be continuously changed, and the second heater current may be continuously changed. As a result, the multiple distributed feedback laser device may continuously oscillate the first light source having the continuously changed first wavelength and the second light source having the continuously changed second wavelength. In this case, the temperatures of the heat generated from the first and second micro heaters 136a and 136b may be different from each other, and thus, the first and second wavelengths of the first and second light sources may be different from each other.

However, the present invention is not limited thereto. The multiple distributed feedback laser device may be used by variously combining the above-described methods according to the requirements of an apparatus in which two light sources are required.

According to the multiple distributed feedback laser device, a wavelength difference between the oscillated first and second light sources may be adjusted by the first and second micro heaters 136a and 136b, which are controlled independently from each other. As a result, the first and second light sources may be more stably oscillated. For example, the first and second light sources may be constituted as one compound resonator to couple the first light source to the second light sources. Thus, phases of the first and second light sources are related to each other, such that a characteristic as if their phase difference is locked may be obtained. In the result, the multiple distributed feedback laser device may more stably oscillate the first and second light sources, and the multiple distributed feedback laser device having superior reliability may be realized. Also, when the THz wave is generated by using the multiple distributed feedback laser device, an oscillation frequency that is a key element of the generation of the THz wave may significantly improve a relative intensity noisy (RIN) of a beat source that has an direct effect on the stable oscillation.

The multiple distributed feedback laser device includes the first distributed feedback laser diode in the first distributed feedback region DFB1, the modulation diode in the modulation region P, and the second distributed feedback laser diode in the second distributed feedback region DFB2 on one of the substrate 100. Thus, the highly integrated multiple distributed feedback laser device may be realized.

In addition, the first wavelength of the first light source and the second wavelength of the second light source may be changed by a period change of the first diffraction grating 112a and a period change of the second diffraction grating 112b, respectively. Thus, a wavelength difference between the first and second light sources can be further accurately controlled by the adjusted periods of the diffraction gratings 112a and 112b and the operation of the micro heaters 136a and 136b.

Furthermore, the active layer 106 is disposed in the modulation region P as well as the distributed feedback regions DFB1 and DFB2. That is, the active layer 106 is continuously disposed in the distributed feedback regions DFB1, the modulation region P and DFB2 of the substrate 100. Thus, the first and second light sources having a coherent characteristic may be continuously oscillated. As a result, since the THz wave is generated using the first and second light sources having the coherent characteristic, a THz wave having a very stable and superior characteristic may be generated.

At least one of the diffraction gratings 112a and 112b may include the complex coupled diffraction grating. Thus, an output having a very high modulation index may be obtained. As a result, generation efficiency of the THz wave generated using the first and second light sources may be very high.

A method of forming a multiple distributed feedback laser device according to an embodiment of the present invention will be described with reference to accompanying drawings.

FIGS. 2A to 2H are cross-sectional views illustrating a method of forming a multiple distributed feedback laser device according to an embodiment of the present invention.

Figure 2A:
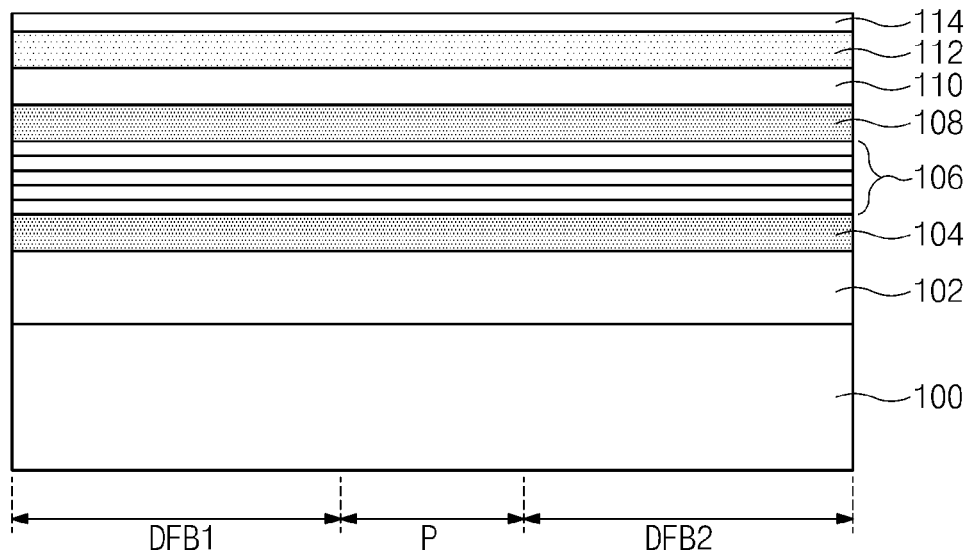
FIGS. 2A to 2H are cross-sectional views illustrating a method of forming a multiple distributed feedback laser device according to an embodiment of the present invention.

Referring to FIG. 2A, a substrate 100 including a first distributed feedback region DFB1, a modulation region P, and a second distributed feedback region DFB2 is prepared. A lower cladding layer 102 may be formed on the substrate 100. The lower cladding layer 102 is formed in the regions DFB1, P, and DFB2 of the substrate 100. The lower cladding layer 102 may be formed of a compound semiconductor doped with a first-type dopant. A first separate confinement hetero layer 104 may be formed on the lower cladding layer 102. An active layer 106 may be formed on the first separate confinement hetero layer 104, and a second separate confinement hetero layer 108 may be formed on the active layer 106. The active layer 106 is formed in the regions DFB1, P, and DFB2 of the substrate 100. Also, the first and second separate confinement hetero layers 104 and 108 are formed in the regions DFB1, P, and DFB2 of the substrate 100.

A first compound semiconductor layer 110 is formed on the second separate confinement hetero layer 108, and a diffraction grating layer 112 is formed on the first compound semiconductor layer 110. The first compound semiconductor layer 110 may be formed of InP. The first compound semiconductor layer 110 may be in an undoped state or doped with a second-type dopant. The diffraction grating layer 112 may be formed of a compound semiconductor for a complex coupled diffraction grating, e.g., InGaAs. The diffraction grating layer 112 may be doped with an n-type dopant or a p-type dopant. On the other hand, the diffraction grating layer 112 may be in an undoped state.

A buffer compound semiconductor layer 114 may be formed on the diffraction grating layer 112. The buffer compound semiconductor layer 114 may be formed of the same material as the first compound semiconductor layer 110.

Figure 2B:
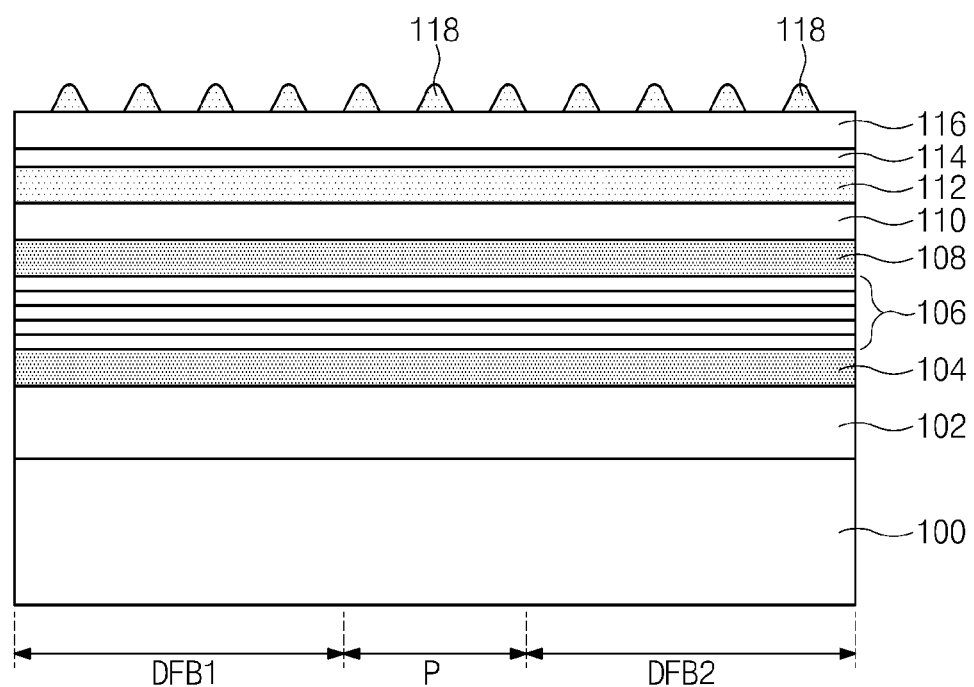

Referring to FIG. 2B, a hard mask layer 116 may be formed on the buffer compound semiconductor layer 114. The hard mask layer may be formed of at least one of nitride, oxide, and oxide-nitride.

A photoresist may be coated on the hard mask layer 116, and the coated photoresist may be patterned to form photoresist patterns 118. The photoresist may be patterned by a holographic system or an electron beam lithography system to form the photoresist patterns 118. Diffraction gratings may be defined by the photoresist patterns. Periods of the photoresist patterns 118 may be adjusted to adjust periods of the diffraction gratings.

Figure 2C:
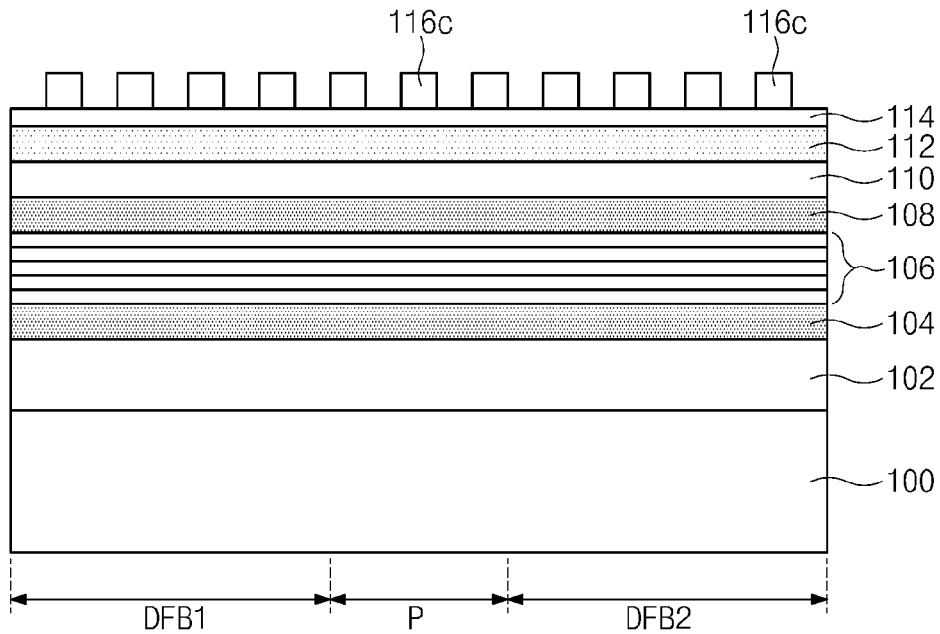

Referring to FIG. 2C, the hard mask layer 116 may be patterned using the photoresist patterns as an etch mask to form hard mask patterns 116a. The hard mask layer 116 may be etched using a magnetically enhanced reactive ion etching process. Then, the photoresist patterns 118 may be removed.

Figure 2D:
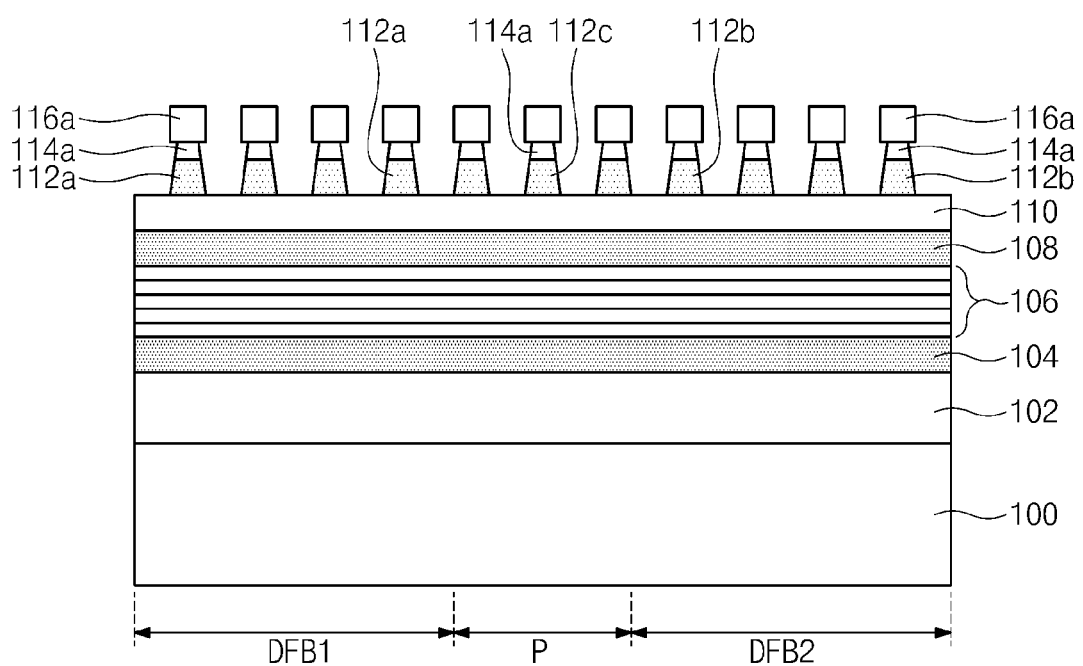

Referring to FIG. 2D, the buffer compound semiconductor layer 114 and the diffraction grating layer 112 are etched using the hard mask patterns 116a as an etch mask. As a result, a first diffraction grating 112a is formed in the first distributed feedback region DFB1, and a second diffraction grating 112b is formed in the second distributed feedback region DFB2. At this time, a remnant grating 112c may be formed in the modulation region P. Buffer compound semiconductor patterns 114a may be formed on the gratings 112a, 112b, and 112c. The etching process that uses the hard mask patterns 116a as the etch mask may include an isotropic etching process (e.g., a wet etching process) and/or a dry etching process.

Figure 2E:
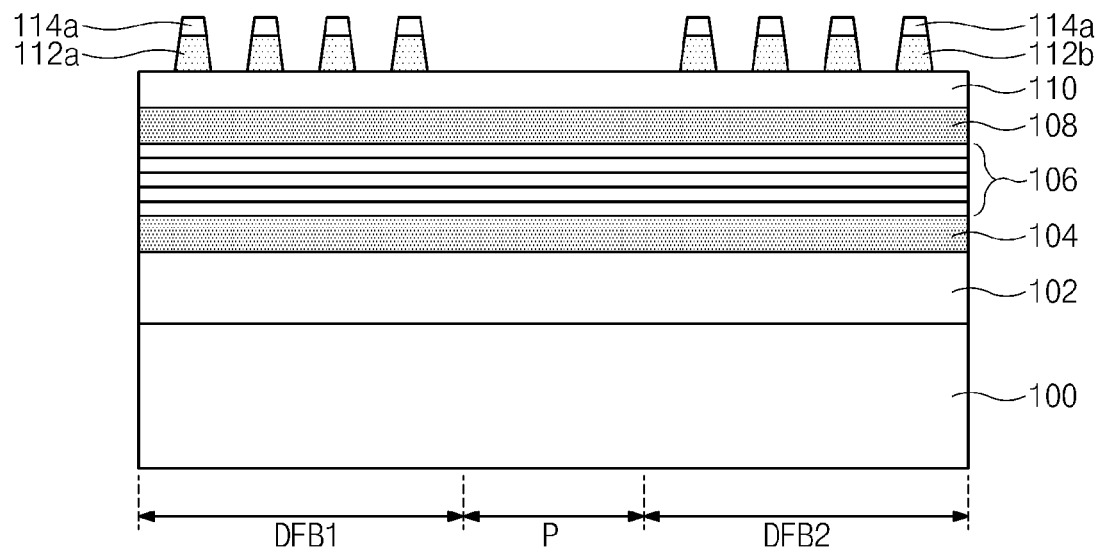

Referring to FIG. 2E, the hard mask patterns 116a are removed. The remnant grating 112c in the modulation region P and the buffer compound semiconductor patterns 114a on the remnant grating 112c are removed. At this time, the first and second diffraction gratings 112a and 112b in the first and second distributed feedback regions DFB1 and DFB2 and the buffer compound semiconductor patterns 114a on the first and second diffraction gratings 112a and 112b remain. A photolithography process may be performed using a mask pattern (not shown) to selectively remove the remnant grating 112c.

Figure 2F:
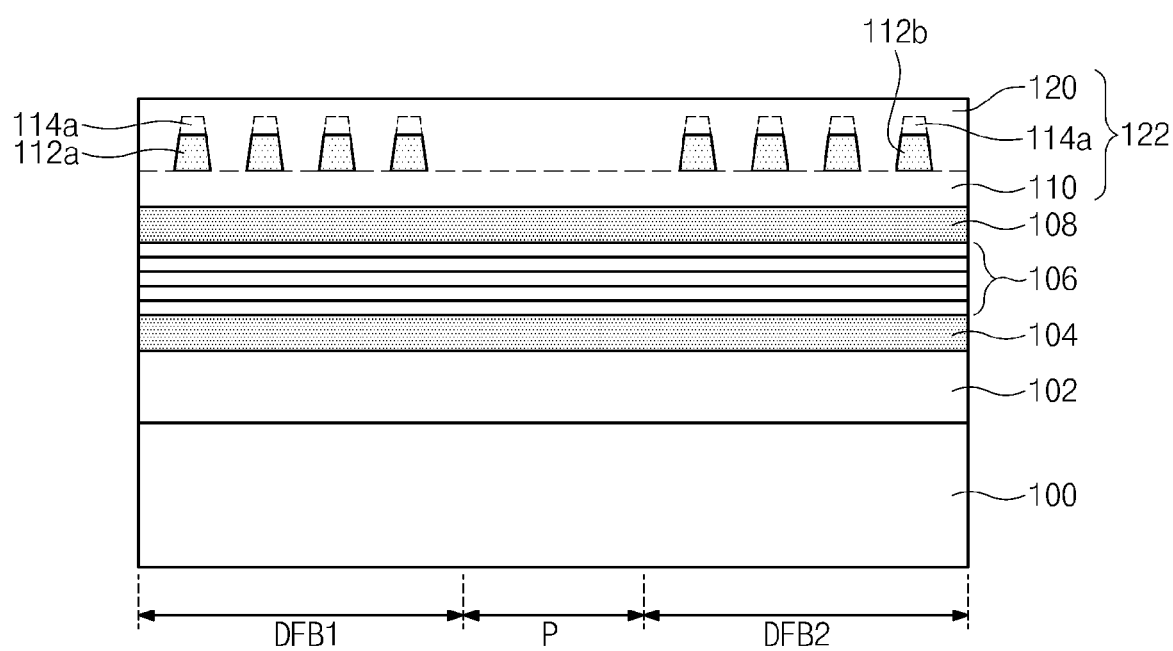

Referring to FIG. 2F, a second compound semiconductor layer 120 may be formed on the substrate 100. The second compound semiconductor layer 120 may be in an undoped state or doped with a second-type dopant. The second compound semiconductor layer 120 may be formed of the same material as the first compound semiconductor layer 110. A metal organic chemical vapor deposition process may be performed to form the second compound semiconductor layer 120. The first compound semiconductor layer 110, the buffer compound semiconductor patterns 114a in the first and second distributed feedback regions DFB1 and DFB2, and the second compound semiconductor layer 120 may constitute a first upper cladding layer 122.

Figure 2G:
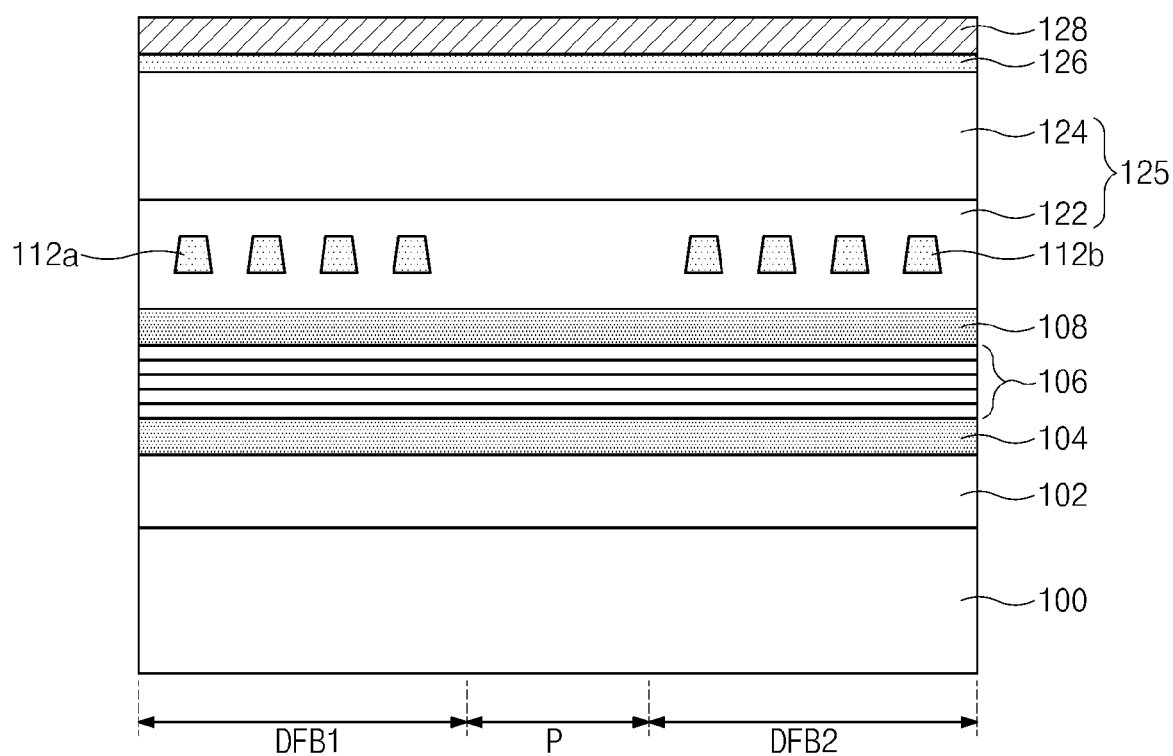

Referring to FIG. 2G, a second upper cladding layer 124 may be formed on the first cladding layer 122. The second upper cladding layer 124 may be formed of a compound semiconductor doped with the second-type dopant. The second upper cladding layer 124 may be formed of the same compound semiconductor as the first upper cladding layer 124. The upper cladding layer may include the first and second upper cladding layers 122 and 124.

An ohmic layer 126 may be formed on the upper cladding layer 125. The ohmic layer 126 may be formed of InGaAs. An electrode layer 128 may be formed on the ohmic layer 126. The electrode layer 128 may be formed of a metal.

Figure 2H:
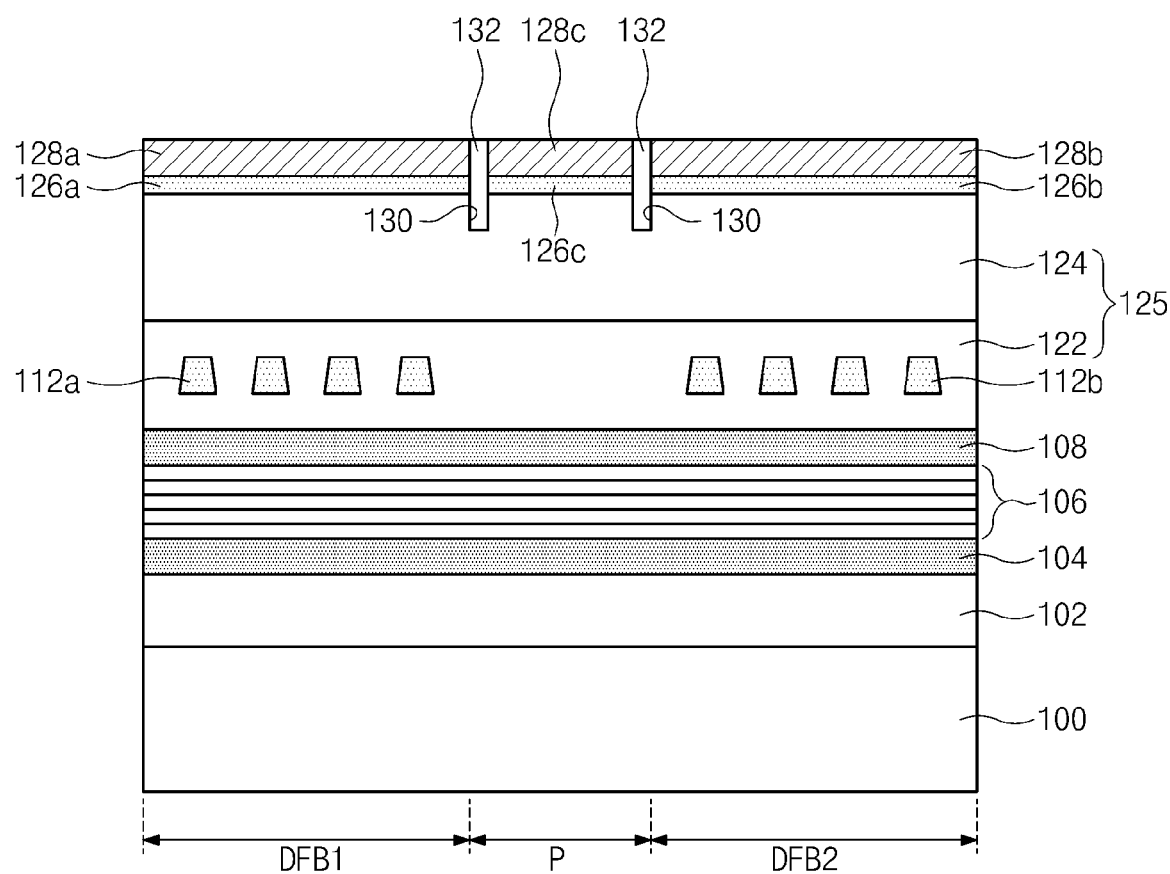

Referring to FIG. 2H, the electrode layer 128, the ohmic layer 126, and the upper cladding layer 125 may be sequentially patterned to form an isolation trench 130. The first distributed feedback laser diode in the first distributed feedback region DFB1, the modulation diode in the modulation region P, and the second distributed feedback laser diode in the second distributed feedback region DFB2 may operate independently from each other by the isolation trench 130.

The isolation trench 130 may be formed to form a first ohmic pattern 126a and a first electrode 128a in the first distributed feedback region DFB1, a second ohmic pattern 126b and a second electrode 128b in the second distributed feedback region DFB2, and a third ohmic pattern 126c and a third electrode 128c in the modulation region P. The electrodes 128a, 128b, and 128c are spaced from each other. Also, the ohmic patterns 126a, 126b, and 126c are spaced from each other. An isolation-insulation pattern 132 may be formed in the isolation trench 130.

According to an embodiment of the present invention, before the electrode layer 128 is formed, the ohmic layer 126 and the upper cladding layer 125 may be sequentially patterned to form the isolation trench 130. In this case, after the isolation trench 130 and the isolation-insulation pattern 132 are formed, the electrodes 128a, 128b, and 128c may be formed on the first, second, and third ohmic patterns 126a, 126b, and 126c, which are separated from each other, respectively.

An interlayer dielectric and a heater layer are sequentially formed on the first electrode 128a. The heater layer and the interlayer dielectric may be sequentially patterned to form a first interlayer dielectric pattern 134a and a first micro heater 136a on the first electrode 128a of FIG. 1 and a second interlayer dielectric pattern 134b and a second micro heater 136b on the second electrode 128a. Thus, the multiple distributed feedback laser device of FIG. 1 may be realized.

According to an embodiment of the present invention, the heater layer may be planarized until the interlayer dielectric is exposed to form the first and second micro heaters 136a and 136b.

According to the above-described multiple distributed feedback laser device, the wavelength difference between the oscillated first and second light sources can be adjusted due to the first and second micro heaters, which are controlled independently from each other. As a result, the first and second light sources can be more stably oscillated. Therefore, the multiple distributed feedback laser device having the superior reliability can be realized.

In the multiple distributed feedback laser device, the first distributed feedback region, the modulation region, and the second distributed feedback region are defined in the substrate. The active layer is disposed in the distributed feedback regions as well as the modulation region. That is, the active layer can be successively disposed in the first distributed feedback region, the modulation region, and the second distributed feedback region of the substrate. Thus, the first and second light sources having the coherent characteristic can be sequentially oscillated. For example, since the plurality of distributed feedback laser devices that are individually oscillated is integrated into one resonator, phases of individually oscillated waves can be coupled and related to each other. As a result, a phenomenon in which the phases of the oscillation waves are locked can be induced. Therefore, the very stable multimode oscillation waves that are a key element of the generation of the THz wave can be sequentially generated. In addition, the highly integrated multiple distributed feedback laser device can be realized.

Furthermore, at least one of the diffraction gratings may include the complex coupled diffraction grating. Thus, the output having the very high modulation index can be obtained. As a result, the generation efficiency of the THz wave generated using the first and second light sources can be very high.

Embodiment 2

Figure 3B:
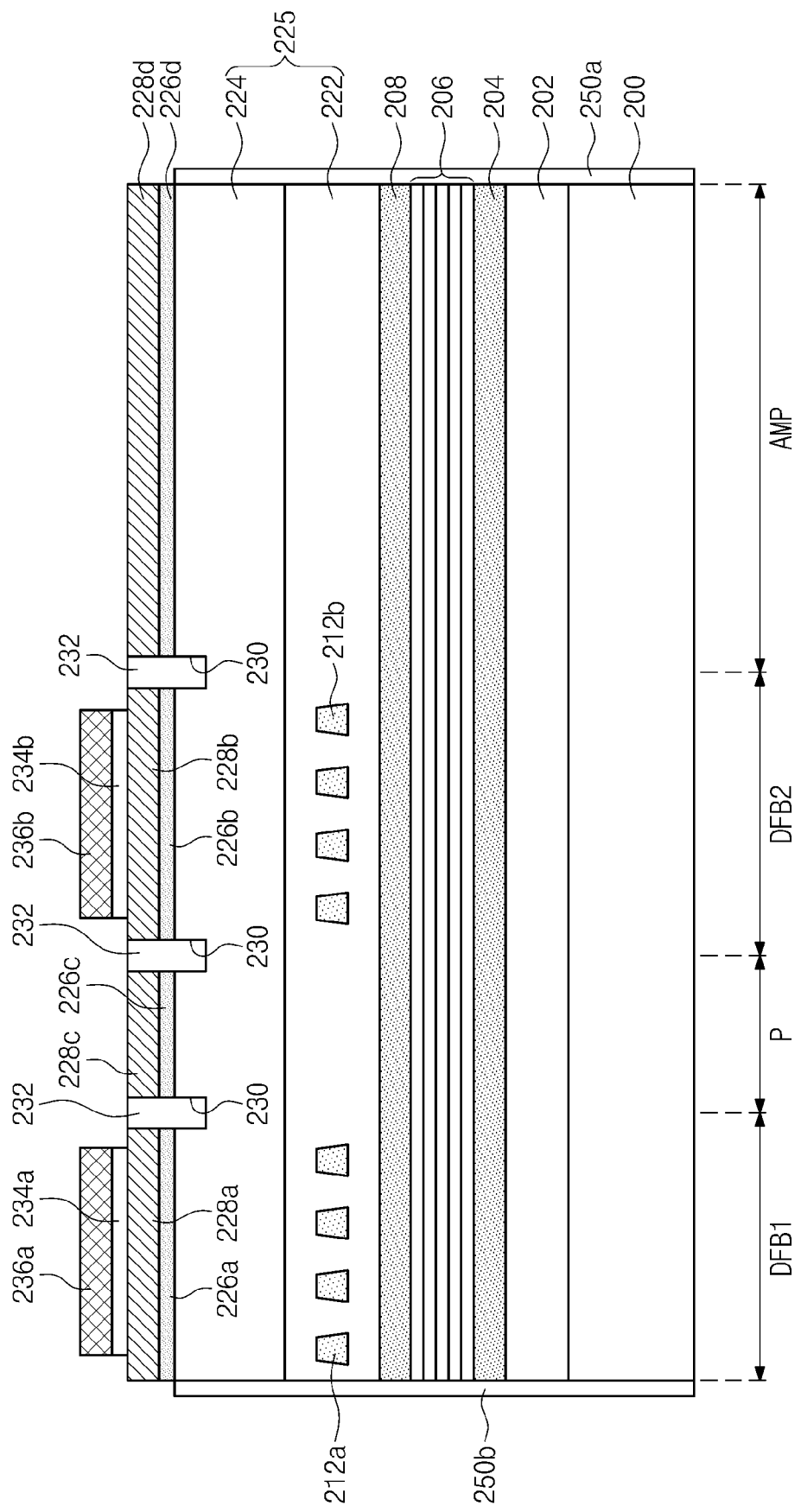
FIG. 3B is a cross-sectional view taken along the line I-I' in FIG. 3A.

FIG. 3A is a top plan view of a multiple distributed feedback laser device according to another embodiment of the present invention, and FIG. 3B is a cross-sectional view taken along the line I-I' in FIG. 3A.

Referring to FIGS. 3A and 3B, a substrate 200 includes a first distributed feedback region DFB1, a modulation region P, a second distributed feedback region DFB2, and an amplification region AMP. The modulation region P may be disposed between the first distributed feedback region DFB1 and the second distributed feedback region DFB2. The amplification region AMP may be disposed at one side of the second distributed feedback region DFB2. That is, the second distributed feedback region DFB2 may be disposed between the modulation region P and the amplification region AMP.

An active layer 106 is disposed on the substrate 200. The active layer 206 is preferably disposed in the first distributed feedback, modulation, and second distributed feedback regions DFB1, P, and DFB2 of the substrate 200. That is, the active layer 206 may extend from the inside of the first distributed feedback region DFB1 to the inside of the amplification region AMP through the modulation region P and the second distributed feedback region DFB2. According to an embodiment, the active layer 206 may exhibit a line shape extending in a first direction when viewed from the top. However, the present invention is not limited thereto. The active layer 206 may exhibit another shape.

The active layer 206 may be formed to have a multiple quantum well structure. The active layers 206 may include first compound semiconductor layers and second compound semiconductor layers that are alternately laminated and have different band gaps. For example, the active layer 206 may include first InGaAsP layers (well) and second InGaAsP layers (barrier) that are alternately laminated and have different band gaps. According to another embodiment, the active layer 206 may exhibit a bulk shape made of InGaAsP having a band gap wavelength of about 1.55 micrometer. The active layer 206 may be in an intrinsic state.

A lower cladding layer 202 may be disposed between the active layer 206 and the substrate 200. An upper cladding layer 225 may be disposed on the active layer 206. Similar to the active layer 106, the lower and upper cladding layers 202 and 225 may extend to be disposed in the first distributed feedback region DFB1, the modulation region P, the second distributed feedback region DFB2, and the amplification region AMP. The lower cladding layer 202 may be made of a compound semiconductor doped with a first-type dopant. At least an upper portion of the upper cladding layer 206 may be doped with a second-type dopant. Of the first-type dopant and the second-type dopant, one is an n-type dopant and the other is a P-type dopant. For example, the lower cladding layer 202 may be made of n-type indium phosphide (InP) and the at least upper portion of the upper cladding layer 225 may be made of p-type InP. To the contrary, the lower cladding layer 202 may be made of the p-type InP and the at least upper portion of the upper cladding layer 225 may be made of the n-type InP. For brevity of description, it will be assumed that the lower cladding layer 202 is made of the n-type InP and the upper cladding layer 225 is made of the p-type InP.

A first separate hetero layer 204 may be disposed between the active layer 206 and the lower cladding layer 202. The first separate hetero layer 204 may be made of a compound semiconductor having a band gap wavelength less than that of the active layer 206. For example, the first separate hetero layer 204 may be made of InGaAsP having a band gap wavelength of about 1.3 micrometer. A second separate hetero layer 208 may be disposed between the active layer 206 and the upper cladding layer 125. Also the second separate hetero layer 208 may be made of a compound semiconductor having a band gap wavelength less than that of the active layer 206. For example, the second separate hetero layer 208 may be made of InGaAsP having a band gap wavelength of about 1.3 micrometer. The first and second separate hetero layers 204 and 208 may extend to be disposed in the first distributed feedback region DFB1, the modulation region P, and the amplification region AMP. According to an embodiment, each of the first and second separate hetero layers 204 and 208 may have a thickness of about 0.1 micrometer. However, the present invention is not limited thereto. The first and second separate hetero layers 204 and 208 may have different thicknesses. Both the first and second separate hetero layers 204 and 208 may be in an intrinsic state.

A first diffraction grating 212a is disposed in the first distributed feedback region DFB1, and a second diffraction grating 212b is disposed in the second distributed feedback region DFB2. A diffraction grating may not be disposed in the modulation region P and the amplification region AMP. The first diffraction grating 212a is coupled to the active layer 206 within the first distributed feedback region DFB1, and the second diffraction grating 212b is coupled to the active layer 206 within the second distributed feedback region DFB2. Light emitted from the active layer 206 within the first distributed feedback region DFB1 may be bragg-reflected by the first diffraction grating 212a to oscillate a first light source having a first wavelength. Light emitted from the active layer 206 within the second distributed feedback region DFB2 may be bragg-reflected by the second diffraction grating 212b to oscillate a second light source having a second wavelength.

According to an embodiment, the first diffraction grating 212a may be disposed within the upper cladding layer 225 in the first distributed feedback region DFB1, and the second diffraction grating 212b may be disposed within the upper cladding layer 225 in the second distributed feedback region DFB2. More specifically, the upper cladding layer 225 may include a first upper cladding layer 222 and a second cladding layer 224 that are sequentially stacked. In this case, the first diffraction grating 212a may be disposed within the first upper cladding layer 222 in the first distributed feedback region DFB1, and the second diffraction grating 212b may be disposed within the first upper cladding layer 222 in the second distributed feedback region DFB2. The second upper cladding layer 224 may be made of a compound semiconductor doped with the second-type dopant. For example, in the case where the lower cladding layer 202 is made of the n-type InP, the second upper cladding layer 224 may be made of the p-type InP. The first upper cladding layer 222 surrounding the diffraction gratings 212a and 212b may be made of an undoped compound semiconductor (e.g., undoped InP, etc.). Alternatively, the first upper cladding layer 222 may be made of a compound semiconductor doped with the second-type dopant (e.g., p-type InP, etc.). However, the present invention is not limited thereto. The first and second diffraction gratings 212a and 212b may be disposed at different positions, which will be described later.

A period of the first diffraction grating 212a may be identical to that of the second diffraction grating 212b. Alternatively, the period of the first diffraction grating 212a may be different from that of the second diffraction grating and 212b. Shapes of the first and second diffraction gratings 212a and 212b may be identical to or different from each other. At least one of the first and second diffraction gratings 212a and 212b may be a loss-coupled diffraction grating, a gain-coupled diffraction grating, an index coupled diffraction grating or a complex coupled diffraction grating. According to an embodiment, in the case where the first and second diffraction gratings 212a and 212b are complex coupled diffraction gratings, they may be made of a compound semiconductor for complex coupling. For example, the first and second diffraction gratings 212a and 212b may be made of InGaAs. The first and second diffraction gratings 212a and 212b may be doped with an n-type dopant or a p-type dopant. According to an embodiment, in the case where the first and second diffraction gratings 212a and 212b are index coupled diffraction gratings, at least one of the first and second diffraction gratings 212a and 212b may be in a λ/4 phase-shifted state. However, the present invention is not limited thereto. The first and second diffraction gratings 212a and 212b may be different types of diffraction gratings.

A first electrode 228a is electrically connected to the upper cladding layer 225 in the first distributed feedback region DFB1, and a second electrode 228b is electrically connected to the upper cladding layer 225 in the second distributed feedback region DFB2. A third electrode 228c is electrically connected to the upper cladding layer 225 in the modulation region P. A fourth electrode 228d is electrically connected to the upper cladding layer 225 in the amplification region AMP.

The first, second, third and fourth electrodes 228a, 228b, 228c and 228d may be disposed on the upper cladding layer 225 in the first distributed feedback region DFB1, the second distributed feedback region DFB2, the modulation region P, and the amplification region AMP, respectively. The first, second, third, and fourth electrodes 228a, 228b, 228c, and 228d are laterally spaced apart from each other by isolation trenches 230. An isolation dielectric pattern 232 may be disposed in the isolation trench 230. That is, the isolation dielectric pattern 232 may be disposed among the first, second, third, and fourth electrodes 228a, 228b, 228c, and 228d. The isolation dielectric pattern 232 may be made of at least one selected from the group consisting of oxide, nitride, and oxynitride. The isolation trench 230 may extend downwardly toward an upper portion of the upper cladding layer 225. That is, a bottom surface of the isolation trench 230 may be lower than a top surface of the upper cladding layer 225. The isolation trenches 230 allow components in the regions DFB1, P, DFB2, and AMP to operate independently. Each of the components in the regions DFB1, P, DFB2, and AMP is a type of diode including the lower and upper cladding layers 202 and 225, the first and second separate hetero layers 204 and 208, and the active layer 206. The components in the regions DFB1, P, DFB2, and AMP will be described later. The isolation trench 230 preferably has a depth at which the components in the regions DFB1, P, DFB2, and AMP are capable of operating independently. In addition, the depth of the isolation trench 230 is preferably adjusted to minimize coupling of the oscillated light sources to the isolation trench 230. That is, the depth of the isolation trench 230 is preferably determined considering independent operations of the components in the regions DFB1, P, DFB2, and AMP and minimization of coupling to oscillated light sources.

According to an embodiment, the first to fourth electrodes 228a, 228b, 228c, and 228d may be isolated from each other by another way, except the isolation trench 230. For example, the first to fourth electrodes 228a, 228b, 228c, and 228d may be isolated from each other by a region into which insulating element is implanted. That is, in FIG. 3B, an isolation region may be formed by implanting insulating element ions into a region where the isolation trench 230 is disposed. The implantation of the insulating element ions is performed by an ion implanter. For example, the insulation element may be iron (Fe). However, the present invention is not limited thereto. The insulating element may be another element.

A first ohmic pattern 226a may be disposed between the first electrode 228a and the upper cladding layer 225 in the first distributed feedback region DFB1. A second ohmic pattern 226b may be disposed between the second electrode 228b and the upper cladding layer 225 in the second distributed feedback region DFB2. A third ohmic pattern 226c may be disposed between the third electrode 228c and the upper cladding layer 225 in the modulation region P. A fourth ohmic pattern 226d may be disposed between the third electrode 228d and the upper cladding layer 225 in the amplification region AMP. The first, second, third, and fourth ohmic patterns 226a, 226b, 226c, and 226d may be isolated from each other by the isolation trench 230. The first, second, third, and fourth ohmic patterns 226a, 226b, 226c, and 226d may be made of the same material. For example, the first, second, third, and fourth ohmic patterns 226a, 226b, 226c, and 226d may be made of InGaAs.

A first micro heater 236a is disposed in the first distributed feedback region DFB1, and a second micro heater 236b is disposed in the second distributed feedback region DFB2. During the operation of a device, the first micro heater 236a may supply heat to the first diffraction grating 212a and the second micro heater 236b may supply heat to the second diffraction grating 212b. The first micro heater 236a may be disposed over the upper cladding layer 225 in the first distributed feedback region DFB1. In this case, preferably, the first micro heater 236a is electrically insulated from the upper cladding layer 225. The second micro heater 236b may be disposed over the upper cladding layer 225 in the second distributed feedback region DFB2. In this case, preferably, the second micro heater 236b is electrically insulated from the upper cladding layer 225.

The first micro heater 236a and the second micro heater 236b are independently controlled. A refractive index of the first diffraction grating 122a may be changed by the heat that the first micro heater 236a supplies. A refractive index of the second diffraction grating 122b may be changed by the heat that the second micro heater 236b supplies.

According to an embodiment, a temperature of the heat supplied by the first micro heater 236a may be different from that of the heat supplied by the second micro heater 236b. According to an embodiment, one of the temperatures of the heats supplied by the first and second micro heaters 236a and 236b may be about 0 degree centigrade. That is, the fact that the temperatures of the heats supplied by the first and second micro heaters 236a and 236b are different from each other includes the fact that one of the first and second micro heaters 236a and 236b supplies heat having a predetermined temperature, and the other does not supply heat.

The first and second micro heaters 136a and 136b may supply the heats to the first and second diffraction gratings 112a and 112b by using Joule's heat, respectively. The first and second micro heaters 136a and 136b may be made of a material having electrical resistance. For example, the first and second micro heaters 136a and 136b may be made of a metal such as chrome (Cr) and gold (Au). According to an embodiment of the present invention, the chrome (Cr) contained in the first and second micro heaters 136a and 136b may be used as a resistor. According to an embodiment of the present invention, the gold (Au) contained in the first and second micro heaters 136a and 136b may be used for bonding to a connection ball and/or used for a resistor. However, the present invention is not limited thereto. The first and second micro heaters 136a and 136b may be made of other materials having electrical resistance.

According to an embodiment, the first micro heater 236a may overlap the first electrode 228a. In this case, the first micro heater 236a may be disposed over the first electrode 228a. The first micro heater 236a is preferably insulated from the first electrode 228a. A first interlayer dielectric pattern 234a may be disposed between the first electrode 228a and the first micro heater 236a. The second micro heater 236b may overlap the second electrode 228b. The second micro heater 236b may be disposed over the second electrode 228b. Preferably, the second micro heater 236b is also insulated from the second electrode 228b. A second interlayer dielectric pattern 234b may be disposed between the second electrode 228b and the second micro heater 236b. The first micro heater 236a and the first electrode 228a may overlap the active layer 206 in the first distributed feedback region DFB1. The second micro heater 236b and the second electrode 228b may overlap the active layer 206 in the second distributed feedback region DFB2. The first and second micro heaters 236a and 236b may be independently controlled from the first and second electrodes 228a and 228b. The first and second interlayer dielectric patterns 234a and 234b may include at least one selected from the group consisting of oxide, nitride, and oxynitride.

A first coating layer 250a may be formed on a first end surface of the active layer 206, and a second coating layer 250b may be formed on a second end surface of the active layer 206. As set forth in FIG. 3B, the first and second end surfaces of the active layer 206 may be substantially perpendicular to a top surface of the substrate 100. The first coating layer 250a may be adjacent to the amplification region AMP, and the second coating layer 250b may be adjacent to the first distributed feedback region DFB1. The first coating layer 250a may be an anti-reflective coating (ARC) layer. The second coating layer 250b may be an ARC layer or a high-reflective coating layer.

The lower cladding layer 202, the first separate hetero layer 204, the active layer 206, the second separate hetero layer 208, the first diffraction grating 212a, and the upper cladding layer 225 in the first distributed feedback region DFB1 may be included in a first distributed feedback laser diode. The lower cladding layer 202, the first separate hetero layer 204, the active layer 206, the second separate hetero layer 208, the second diffraction grating 212b, and the upper cladding layer 225 in the second distributed feedback region DFB2 may be included in a second distributed feedback laser diode. The lower cladding layer 202, the first separate hetero layer 204, the active layer 206, the second separate hetero layer 208, and the upper cladding layer 225 in the modulation region P may be included in a modulation diode. The lower cladding layer 202, the first separate hetero layer 204, the active layer 206, the second separate layer 208, and the upper cladding layer 225 in the amplification region AMP may be included in a light amplifying diode.

First laser current may be supplied to the active layer 206 in the first distributed feedback laser diode. The first laser current may be supplied by applying a forward bias to the first distributed feedback laser diode. The first laser current may be applied to generate light at the active layer 206 of the first distributed feedback laser diode. The generated light is bragg-reflected by the first diffraction grating 212a to oscillate the first light source having only a first wavelength. The first wavelength of the first light source may be changed by change in refractive index of the first diffraction grating 212a. For example, the first wavelength of the first light source may be in proportion to the refractive index of the first diffraction grating 212a. By supplying the first heater current to the first micro heater 236a, heat of the first temperature is supplied to the first diffraction grating 212a to change the refractive index of the first diffraction grating 212a. Thus, the first wavelength of the first light source may be changed. That is, the first wavelength of the first light source may be changed by the first heater current supplied to the first micro heater 236a.

Second laser current may be supplied to the active layer 206 in the second distributed feedback laser diode through the second electrode 228b. The second laser current may be supplied to the second electrode 228b by applying a forward bias to the second distributed feedback laser diode. The second laser current may be applied to generate light at the active layer 206 of the second distributed feedback laser diode. The generated light in the second distributed feedback laser diode is bragg-reflected by the second diffraction grating 212b to oscillate the second light source having a second wavelength. The second wavelength of the second light source may be changed by change in refractive index of the second diffraction grating 212b. By supplying the second heater current to the second micro heater 236b, heat of a second temperature is supplied to the second diffraction grating 212b to change the refractive index of the second diffraction grating 212b. Thus, the second wavelength of the second light source may be changed. That is, the second wavelength of the second light source may be changed by the second heater current supplied to the second micro heater 236b. According to an embodiment, the second wavelength of the second light source may be different from the first wavelength of the first light source.

A reverse bias may be applied to the modulation diode through the third electrode 228c. As a result, an electroabsorption (EA) phenomenon may occur within the modulation diode. Except main oscillation modes of the first and second light sources, side modes may be absorbed due to the electroabsorption phenomenon. Thus, the first and second light sources may be very stably oscillated and have a coherent characteristic. The modulation region P with the modulation diode disposed therein may have a limited length (e.g., distance between the first and second distributed feedback regions DFB1 and DFB2) to minimize optical loss. For example, the modulation region P may have a length less than about 50 micrometers.

Amplification current may be supplied to the light amplifying diode through the fourth electrode 228d. The amplification current may be supplied by applying a forward bias to the fourth electrode 228d. The first and second light sources having stable and coherent characteristics due to the modulation region P may be amplified by the light amplifying diode.

A method for operating the above-described multiple distributed feedback laser device will now be described. The first and second laser currents may be supplied to the first and second distributed feedback laser diodes through the first and second electrodes 228a and 228b, respectively. Thus, the first light source of the first wavelength and the second light source of the second wavelength are oscillated from the first and second distributed feedback laser diodes, respectively. At least one of the first and second wavelengths may be changed by operating at least one of the first and second micro heaters 236a and 236b. As a result, the first and second light sources of different wavelengths may be oscillated. The first and second light sources may have much more stable coherent characteristics than the modulation diode. In addition, the first and second light sources may be amplified by the light amplifying diode supplied with the amplification current to oscillate the first and second light sources.

According to an embodiment of the present invention, the second heater current may be supplied to the second micro heater 236b without operation of the first micro heater 236a.

In this case, the second heat current may be changed successively. As the second heat current is changed, a temperature of the heat supplied to the second micro heater 236b may be changed to change a refractive index of the second diffraction grating 212b. Thus, the second wavelength of the second light source may be changed successively and stably. According this embodiment, the multiple distributed feedback laser device may successively oscillate a first light source of a first wavelength that is fixed and a second light source of a second wavelength that is successively changed. The oscillated first and second light sources may be provided to a photomixer through a resonator. In this case, a variable terahertz wave may be generated.

According to another embodiment of the present invention, the first heater current may be supplied to the first micro heater 236a and the second micro heater 236b may not operate. In this case, the first heater current may be successively changed to successively oscillate a first light source of a first wavelength that is successively changed and a second light source of a second wavelength that is fixed.

According to yet another embodiment of the present invention, the first heat current may be supplied to the first micro heater 236a and the second heater current may be supplied to the second micro heater 236b. At this point, the first heater current may be successively changed and the second heat current may be successively changed. Thus, the multiple distributed feedback laser device may oscillate a first light source of a first wavelength that is successively changed and a second light source of a second wavelength that is successively changed. In this case, temperatures of heats generated from the first and second micro heaters 236a and 236b may be made different to make the first and second wavelengths of the first and second light sources different.

The present invention is not limited thereto. The multiple distributed feedback laser device may be used through combination of the above-described methods according to the requirement of an apparatus which needs two light sources.

According to the above-described multiple distributed feedback laser device, a difference in wavelength between the first and second light sources oscillated by the first and second micro heaters 236a and 236b may be adjusted. Thus, the very stable first and second light sources may be oscillated. For example, the first and second light sources constitute a compound resonator, so that oscillated first and second light sources are coupled with each other. Thus, the first and second light sources do not act as independent light sources and phases of the first and second light sources have correlation to obtain a characteristic as if their phase difference is locked. As a result, a high-reliability multiple distributed feedback laser device may be realized.

In addition, the first and second light sources may be oscillated with high power due to the light amplifying diode in the amplification region AMP. Thus, a dual mode light source of high stability and high efficiency may be oscillated.

In addition, the multiple distributed feedback laser device includes a first distributed feedback laser diode in the first distributed feedback region DFB1, a modulation diode in the modulation region P, a second distributed laser diode in the second distributed feedback region DFB2, and a light amplifying diode in the amplification region AMP which are mounted together with the substrate 200. Thus, a high-integration multiple distributed feedback laser device may be realized.

In addition, the first wavelength of the first light source and the second wavelength of the second light source may be changed by change in period of the first diffraction grating 212a and change in period of the second diffraction grating 212b, respectively. Thus, a difference in wavelength between the first and second light sources may be controlled more precisely by operation of the micro heaters 236a and 236b and change in periods of the diffraction gratings 212a and 212b.

In addition, the active layer 206 extends to the inside of the amplification region AMP from the inside of the first distributed feedback region DFB1 through the modulation region P and the second distributed feedback region DFB2. Accordingly, internal loss resulting from mode mismatching may be minimized As a result, the first and second light sources of high efficiency and/or high power may be oscillated.

In addition, an electroabsorption phenomenon occurs in the modulation diode by applying a reverse bias to the modulation diode. Thus, the first and second light sources having high stability and coherent characteristics may be oscillated.

In addition, at least one of the diffraction gratings 212a and 212b may be a complex coupled diffracting grating. Accordingly, an output of a very high modulation index may be obtained to significantly enhance generation efficiency of a terahertz wave generated using the first and second light sources.

According to the above-described multiple distributed feedback laser device, the first and second diffraction gratings 212a and 212b may be disposed inside the upper cladding layer 225. Alternatively, the first and second diffraction gratings 212a and 212b may be disposed at another position, which will be described below with reference to figures.

Figure 4B:
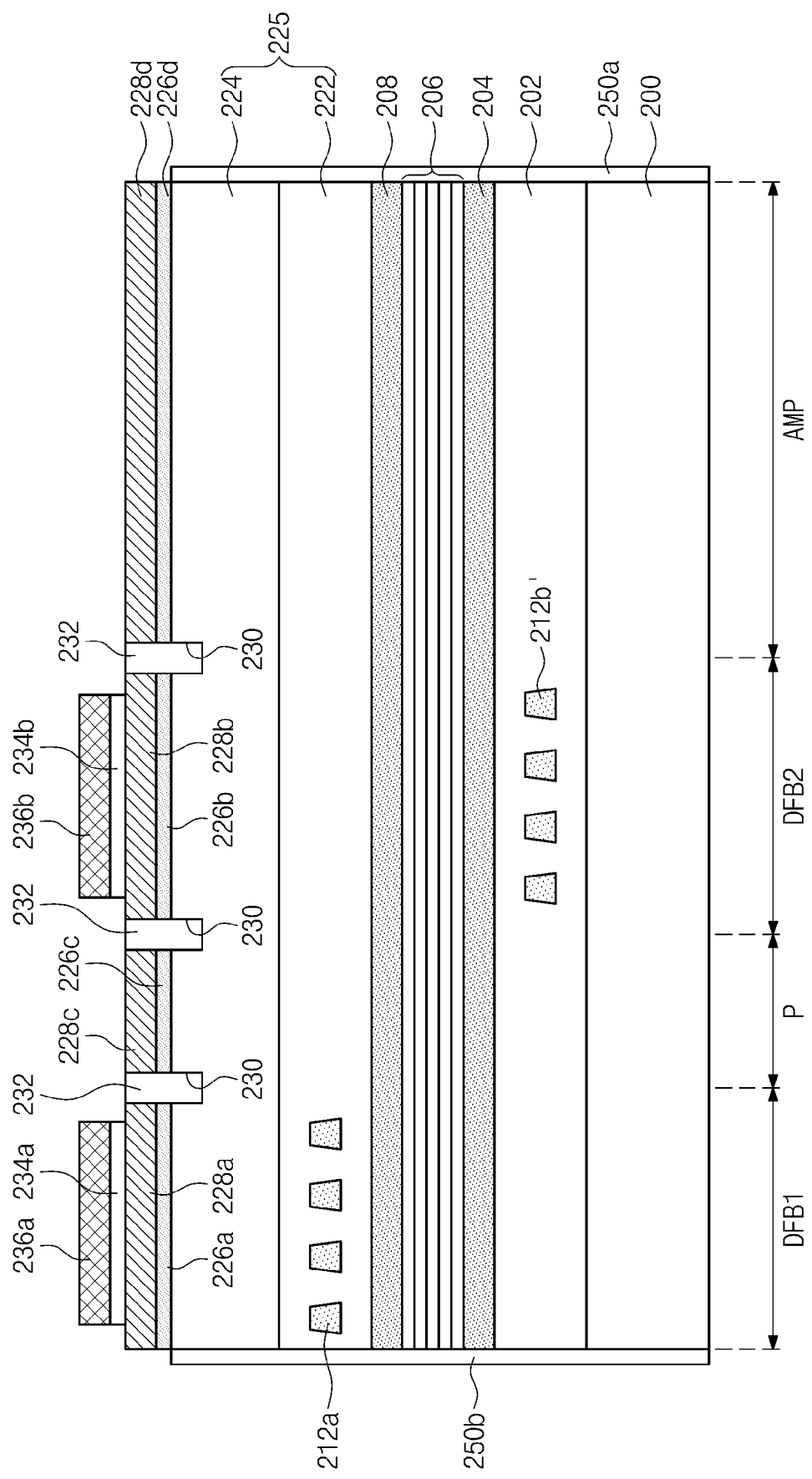
FIG. 4B is a top plan view illustrating another modified embodiment of the multiple distributed feedback laser device according to another embodiment of the present invention.

FIG. 4A is a cross-sectional view, taken along the line I-I' in FIG. 3A, illustrating a modified embodiment of the multiple distributed feedback laser device according to another embodiment of the present invention. FIG. 4B is a top plan view illustrating another modified embodiment of the multiple distributed feedback laser device according to another embodiment of the present invention.

Referring to FIG. 4A, a first diffraction grating 212a' may be disposed inside the lower cladding layer 202. Similarly, the second diffraction grating 212b' may be disposed inside the lower cladding layer 202 in a second distributed feedback region DFB2.

Alternatively, as shown in FIG. 4B, a first diffraction grating 212a may be disposed inside an upper cladding layer 225 in a first distributed feedback region DFB1 and a second diffraction grating 212b' may be disposed inside a lower cladding layer 202 in the second distributed feedback region DFB2. To the contrary, a first diffraction grating may be disposed inside a lower cladding layer 202 in the first distributed feedback region DFB1 and a second diffraction grating may be disposed inside an upper cladding layer 225 in the second distributed feedback region DFB2. That is, according to the modified embodiment, one of first and second diffraction gratings may be disposed in an upper cladding layer and the other may be disposed inside a lower cladding layer.

As described in FIG. 3A, when viewed from the top, the active layer 206 may have a substantially uniform value in the amplification region AMP. Alternatively, the active region 206 may have another shape.

FIG. 4C is a top plan view illustrating yet another modified embodiment of the multiple distributed feedback laser device according to another embodiment of the present invention.

Referring to FIG. 4C, when viewed from the top, an active layer 206m may have a taper shape in an amplification region AMP. For example, when viewed from the top, width of the active layer 206m in the amplification region AMP may increase gradually toward a first coating layer 250a from one end of a second distributed feedback region DFB2. In this case, when viewed from the top, the active region 206m in a first distributed feedback region DFB1, a modulation region P, the second distributed feedback region DFB2 may have substantially uniform width. Since the active layer 206m in the amplification region AMP has a taper shape, each of the first and second light sources may be amplified while being maintained in a single mode. A portion of a fourth electrode 228dm overlapping the active region 206m in the amplification region AMP may also have a taper shape.

Next, a method for fabricating a multiple distributed laser device will now be described below with reference to accompanying drawings.

FIGS. 5A to 5H are cross-sectional views, taken along the line I-I' in FIG. 3A, illustrating a method for fabricating the multiple distributed feedback laser device according to another embodiment of the present invention.

Figure 5A:
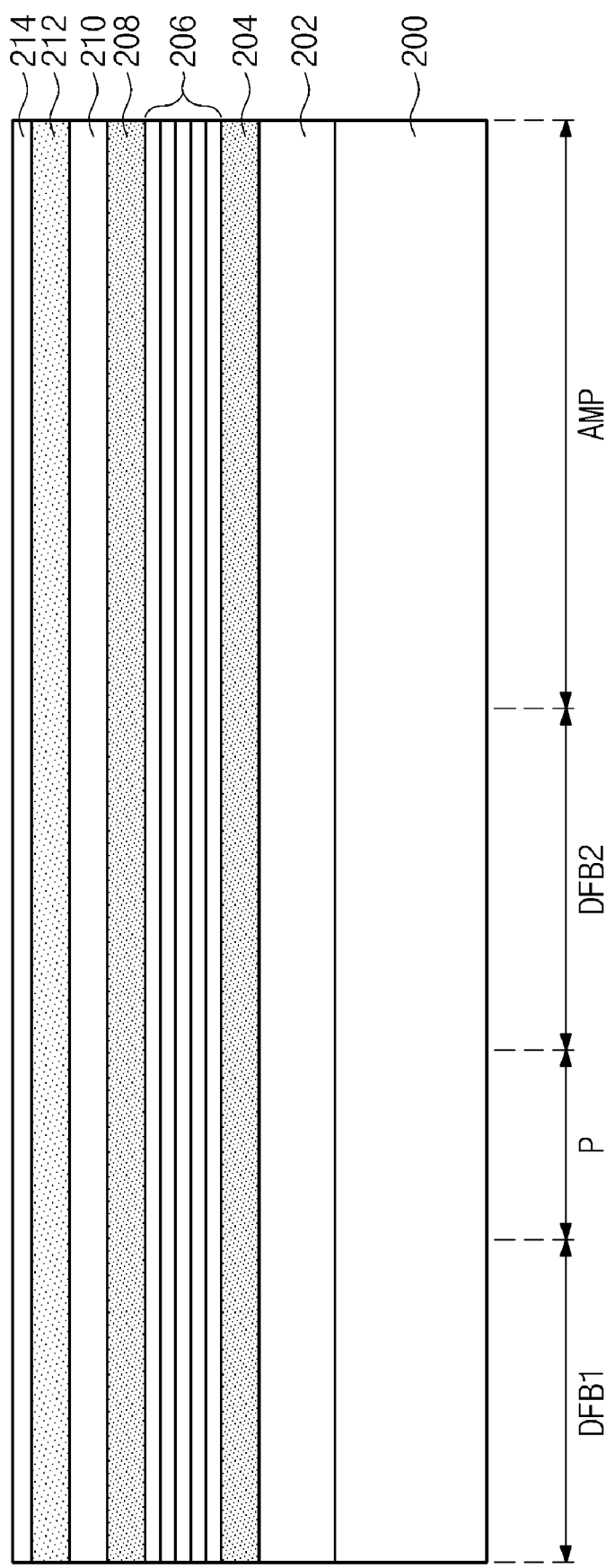

Referring to FIG. 5A, a substrate 200 is prepared which includes a first distributed feedback region DFB1, a modulation region P, a second distributed feedback region DFB2, and an amplification region AMP. A lower cladding layer 202 may be formed on the substrate 200. The lower cladding layer 202 may be formed on the substrate 200 of the regions DFB1, P, DFB2, and AMP. The lower cladding layer 202 may be formed of a compound semiconductor doped with a first-type dopant.

A first separate hetero layer 204 may be formed on the lower cladding layer 202. An active layer 206 may be formed on the first separate hetero layer 204. When viewed from the top, the active region 206 has a shape of line extending in one direction, as previously shown in FIG. 3A. The active layer 206 may extend to the inside of the amplification region AMP from the inside of the first distributed feedback region DFB1 through the modulation region P and the second distributed feedback region DFB2. A second separate hetero layer 208 may be formed on the active region 206. The first and second separate hetero layers 204 and 208 are also formed on the substrate 100 of the regions DFB1, P, DFB2, and AMP. According to an embodiment, when viewed from the top, the active layer 206 may be formed together with an active layer 206m shown in FIG. 4C.

A first compound semiconductor layer 210 may be formed on the second separate hetero layer 208. A diffraction grating layer 212 may be formed on the first compound semiconductor layer 210. The first compound semiconductor layer 210 may be formed of indium phosphide (InP). The first compound semiconductor layer 210 may be undoped state, or doped with a second-type dopant. The diffraction grating layer 212 may be formed of a compound semiconductor for a complex coupled diffraction grating, e.g., InGaAs. The diffraction grating layer 212 may be doped with an n-type dopant or a p-type dopant. Alternatively, the diffraction grating layer 212 may be undoped. A buffer compound semiconductor layer 214 may be formed on the diffraction grating layer 212. The buffer compound semiconductor layer 214 may be formed of the same material as the first compound semiconductor layer 210.

Referring to FIG. 5B, a hard mask layer 216 may be formed on the buffer compound semiconductor layer 214. The hard mask layer 216 may include at least one selected from the group consisting of oxide, nitride, and oxynitride. A photoresist layer may be coated on the hard mask layer 216. The photoresist layer may be patterned to form photoresist patterns 218. The photoresist layer may be patterned by a holographic system or an electron beam lithographic system to form the photoresist pattern 218. The photoresist pattern 218 may define diffraction gratings. Periods of the photoresist patterns 218 may be adjusted to adjust periods of the diffraction gratings.

Referring to FIG. 5C, the hard mask layer 216 may be patterned using the photoresist patterns 218 as etch masks. Thus, hard mask patterns 216a may be formed. The hard mask layer 216 may be etched by means of magnetically enhanced reactive ion etching. Thereafter, the photoresist patterns 218 may be removed.

Referring to FIG. 5D, the buffer compound semiconductor layer 214 and the diffraction grating layer 212 may be etched using the hard mask patterns 216a as etch masks. Thus, a first diffraction grating 212a may be formed in the first distributed feedback region DFB1 and a second diffraction grating 212b may be formed in the second distributed feedback region DFB2. At this point, a first remnant grating 212c may be formed in the modulation region P and a second remnant grating 212d may be formed in the amplification region AMP. Buffer compound semiconductor patterns 214a may be formed on the gratings 212a, 212b, 212c, and 212d. An etch process using the hard mask patterns 216a as etch masks may be an isotropic etch (e.g., wet etch, etc.) process and/or a dry etch process.

Referring to FIG. 5E, the hard mask patterns 216a may be removed. Thereafter, the remnant gratings 212c and 212d in the modulation region P and the amplification region AMP may be removed. At this point, the first and second diffraction gratings 212a and 212b and the buffer compound patterns 214a on the first and second diffraction gratings 212a and 212b may remain. A mask pattern (not shown) formed by means of a photolithography process may be used to selectively remove the remnant gratings 212c and 212d.

Referring to FIG. 5F, a second compound semiconductor layer 220 may be formed on the substrate 200. The second compound semiconductor layer 220 may be undoped or doped with a second-type dopant. The second compound semiconductor layer 220 may be formed of the same material as the first compound semiconductor layer 210. The second compound semiconductor layer 220 may be formed by means of metal organic chemical vapor deposition (MOCVD). The first compound semiconductor layer 210, the buffer compound semiconductor patterns 214a in the first and second distributed feedback regions DFB1 and DFB2, and the second compound semiconductor layer 220 may constitute a first upper cladding layer 222.

Referring to FIG. 5G, a second upper cladding layer 224 may be formed on eh first upper cladding layer 222. The second upper cladding layer 224 may be formed of a compound semiconductor doped with a second-type dopant. The second upper cladding layer 224 may be formed of the same material as the first upper cladding layer 222. The first and second upper cladding layers 222 and 224 may be included in an upper cladding layer 225. An ohmic layer 226 may be formed on the upper cladding layer 225. An electrode layer 228 may be formed on the ohmic layer 226. The electrode layer 228 may include a metal.

Referring to FIG. 5H, the electrode layer 228, the ohmic layer 226, and the upper cladding layer 225 may be successively patterned to form an isolation trench 230. Due to the isolation trench 230, a first distributed feedback diode in the first distributed feedback region DFB1, a modulation diode n the modulation region P, a second distributed feedback laser diode in the second distributed feedback region, and a light amplifying diode in the amplification region may operate independently. The isolation trench 230 may be formed to form a first ohmic pattern 226a and a first electrode 228a in the first distributed feedback region DFB1, a second ohmic pattern 226b and a second electrode 228b in the second distributed feedback region DFB2, a third ohmic pattern 226c and a third electrode 228c in the modulation region P, and a fourth ohmic pattern 226d and a fourth electrode 228d in the amplification region AMP. The electrodes 228a, 228b, 228c, and 228d are spaced apart from each other. An isolation dielectric pattern 232 may be formed in the isolation trench 230.

According to another embodiment, prior to formation of the electrode layer 228, the ohmic layer 226 and the upper cladding layer 225 may be successively patterned to form the isolation trench 230. In this case, the isolation trench 230 and the isolation dielectric pattern 232 may be formed to form the first to fourth electrodes 228a, 228b, 228c, and 228d on the first to fourth ohmic patterns 226a, 226b, 226c, and 226d, respectively.

An interlayer dielectric and a heater layer may be sequentially formed on the substrate 200. The heater layer and the interlayer dielectric may be successively patterned to form the first interlayer dielectric pattern 234a and the first micro heater 236a that are stacked and the second interlayer dielectric pattern 234b and the second micro heater 236b that are stacked, which are shown in FIGS. 3A and 3B.

The method for forming the first and second diffraction gratings 212a and 212b described with reference to FIGS. 3A to 3F may be applied to the lower cladding layer 202 and an upper cladding layer may be simply deposited on the active layer 206. In this case, the multiple distributed feedback laser device described in FIG. 4A may be realized.

Alternatively, one of the first and second diffraction gratings may be formed in the lower cladding layer 202 and the other may be formed in the upper cladding layer 225 by means of the method for forming diffraction gratings shown in FIGS. 5A to 5F. Thus, the multiple distributed feedback laser device described in FIG. 4B may be realized.

Embodiment 3

A multiple distributed feedback laser device according to this embodiment is similar to that described with reference to FIGS. 3A and 3B. The same numerals in this embodiment as those in the first embodiment denote the same elements.

Figure 6A:
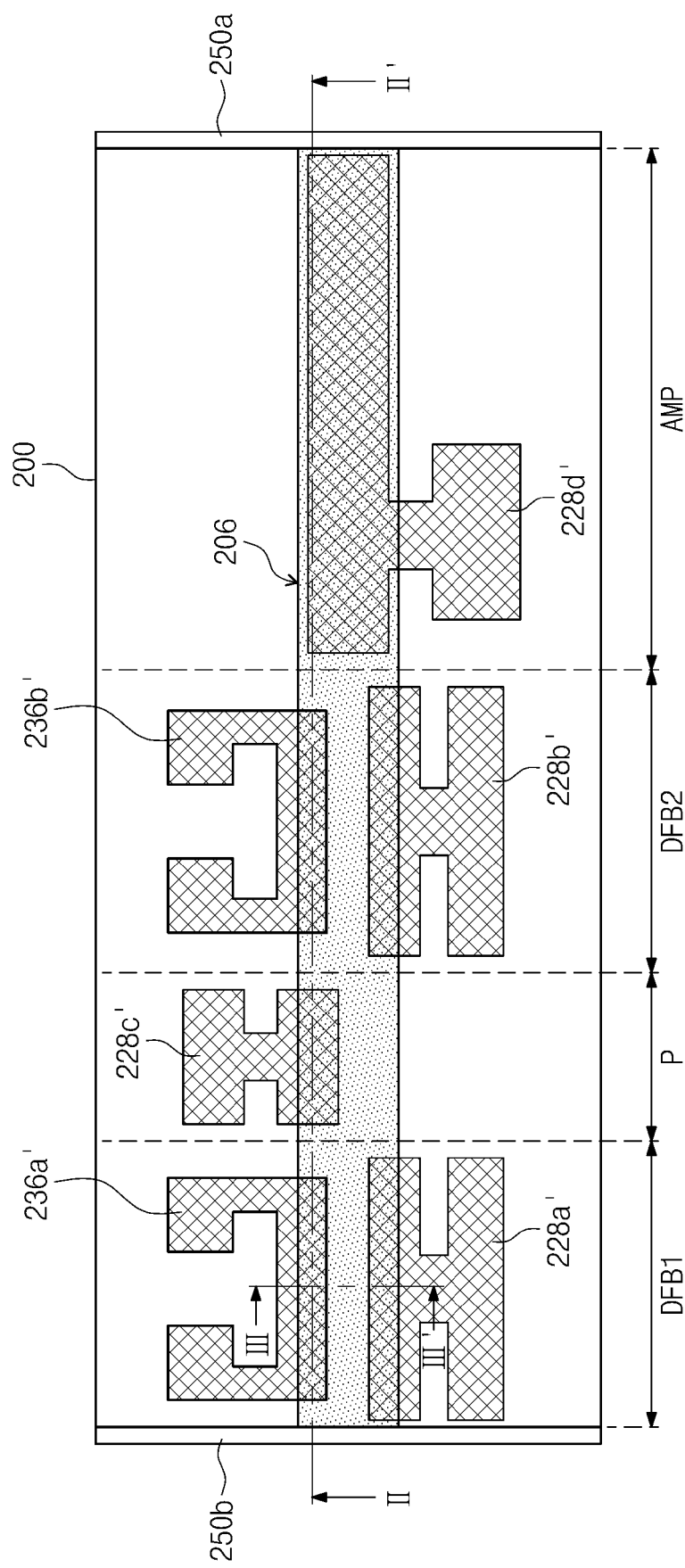
FIG. 6A is a top plan view of a multiple distributed feedback laser device according to yet another embodiment of the present invention.
Figure 6C:
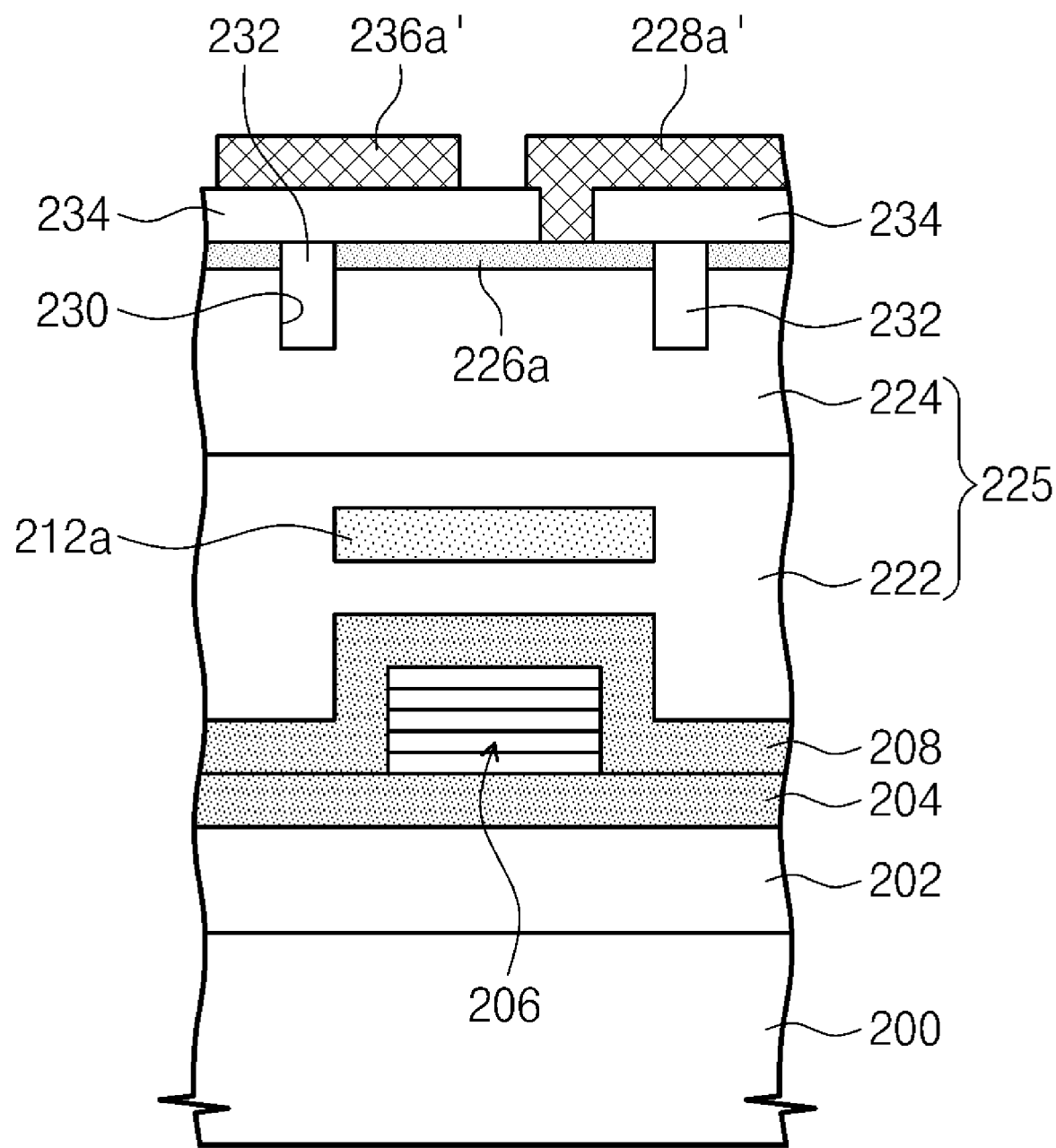
FIG. 6C is a cross-sectional view taken along the line III-III' in FIG. 6A.

FIG. 6A is a top plan view of a multiple distributed feedback laser device according to yet another embodiment of the present invention, FIG. 6B is a cross-sectional view taken along the line II-II' in FIG. 6A, and FIG. 6C is a cross-sectional view taken along the line III-III' in FIG. 6A. FIG. 7 is a cross-sectional view illustrating a modified embodiment of the multiple distributed feedback laser device according to yet another embodiment of the present invention.

Referring to FIGS. 6A, 6B, and 6C, an isolation trench 230 may be formed at an upper portion of an upper cladding layer 225 and filled with an isolation dielectric pattern 232. The isolation trench 230 may divide the upper cladding layer 225 into a first region, a second region, a third region, and a fourth region. The first region of the upper cladding layer 225 may be disposed within a first distributed feedback region DFB1, and the second region of the upper cladding layer 225 may be disposed within a second distributed feedback region DFB2. The third region of the upper cladding layer 225 may be disposed within a modulation region P, and the fourth region of the upper cladding layer 225 may be disposed within an amplification region AMP. The first to fourth ohmic patterns 226a, 226b, 226c, and 226d may be disposed on the first to fourth regions of the upper cladding layer 225, respectively. The first to fourth ohmic patterns 226a, 226b, 226c, and 226d may be self-aligned with the first to fourth regions of the upper cladding layer 225, respectively. That is, the isolation dielectric pattern 232 may extend upwardly to be disposed among the first to fourth ohmic patterns 226a, 226b, 226c, and 226d. The first to fourth ohmic patterns 226a, 226b, 226c, and 226d may be disposed at the substantially same level from a top surface of the substrate 200.

An interlayer dielectric 234 may be disposed on the substrate 200. The interlayer dielectric 234 may include oxide, nitride or oxynitride. A first micro heater 236a' and a first electrode 228a' may be disposed on the interlayer dielectric 234 in the first distributed feedback region DFB1. The first micro heater 236a' may be laterally spaced apart from the first electrode 228a'. Thus, the first micro heater 236a' may not overlap the first electrode 228a'. The first micro heater 236a' may overlap a portion of an active layer 206 in the first distributed feedback region DFB1, and the first electrode 228a' may overlap another portion of the active layer 206 in the first distributed feedback region DFB1. A portion of the first electrode 228a' may extend downwardly to penetrate the interlayer dielectric 234. Thus, the first electrode 228a' may come in contact with the first ohmic pattern 226a. Alternatively, the first micro heater 236a' may be insulated from the first ohmic pattern 226a by the interlayer dielectric 234.

Similarly, a second micro heater 236b' and a second electrode 228b' may be disposed on the interlayer dielectric 234 in the second distributed feedback region DFB2. The second micro heater 236b' may be laterally spaced apart from the second electrode 228b'. Thus, the second micro heater 236b' may not overlap the second electrode 228b'. The second micro heater 236b' may overlap a portion of the active layer 206 in the second distributed feedback region DFB2, and the second electrode 228b' may overlap another portion of the active layer 206 in the second distributed feedback region DFB2. A portion of the second electrode 228b' may extend downwardly to penetrate the interlayer dielectric 234. As a result, the second electrode 228b' may be connected to the second ohmic pattern 226b. The second micro heater 236b' may be insulated from the second ohmic pattern 226b by the interlayer dielectric 234.

A third electrode 228c' may be disposed on the interlayer dielectric 234 in the modulation region P, and a fourth electrode 228d' may be disposed on the interlayer dielectric 234 in the amplification region AMP. A portion of the third electrode 228c' may extend downwardly to penetrate the interlayer dielectric 234. As a result, the third electrode 228c' may be connected to the third ohmic pattern 226c. The fourth electrode 228d' may extend downwardly to penetrate the interlayer dielectric 234. As a result, the fourth electrode 228d' may be connected to the third ohmic pattern 226d.

According to this embodiment, the first and second micro heaters 236a' and 236b' may be disposed at the substantially same level as at least portions of the first to fourth electrodes 228a', 228b', 228c', and 228d', on the basis of the top surface of the substrate 200. The first to fourth electrodes 228a', 228b', 228c', and 228d' ay include he same material as the first and second heaters 236a' and 236b'. The first and second micro heaters 236a' and 236b' may be formed of the same material as the first and second micro heaters 236a and 236b according to the first embodiment.

Also in the multiple distributed feedback laser device shown in FIGS. 6A, 6B, and 6C, the first and second diffraction gratings 212a and 212b may be disposed inside the lower cladding layer 202. Alternatively, one of the first and second diffraction gratings 212a and 212b may be disposed inside the lower cladding layer 202 and the other may be disposed inside the upper cladding layer 225.

The method for fabricating a multiple distributed feedback laser device according to this embodiment may be identical to that described with reference to FIGS. 5A to 5H, except formation of electrodes and formation of heaters. A method for forming heaters and electrodes of a multiple distributed feedback laser device according to this embodiment will now be described in brief. After forming an isolation trench 230 to isolate first to fourth ohmic patterns 226a, 226b, 226c, and 226d, an interlayer dielectric 234 may be formed on a substrate 200. First to fourth openings may be formed through the interlayer dielectric 234 to expose the first to fourth ohmic patterns 226a, 226b, 226c, and 226d, respectively. A conductive layer may be formed to fill the first to fourth openings and then patterned to form the heaters 236a' and 236b' and the first to fourth electrodes 228a', 228b', 228c', and 228d. The first to fourth electrodes 228a', 228b', 228c', and 228d' may fill the first to fourth openings, respectively.

As described in FIG. 6A, the active layer 206 may have a substantially uniform width, when viewed from the top.

Alternatively, as described in FIG. 7A, the active layer 206m in the amplification region AMP may have a taper shape. In this case, the active layer 206m in the first distributed feedback region DFB1, the modulation region P, and the second distributed feedback region DFB2 may have a substantially uniform width, when viewed from the top. In this case, a portion of a fourth electrode 228dm' overlapping the active layer 206m in the amplification region AMP may have a taper shape.

According to the above-described multiple distributed feedback laser device, a difference in wavelength between oscillated first and second light sources can be adjusted due to the first and second micro heaters. As a result, high-stability first and second light sources can be oscillated. In addition, the first and second light sources are amplified in an amplification region. As a result, high-power first and second light sources can be oscillated.

The multiple distributed feedback laser device includes a first distributed feedback region, a modulation region, a second distributed feedback region, and an amplification region which are mounted together with a substrate. Thus, a high-integration multiple distributed feedback device may be realized.

Furthermore, an active layer is disposed not only in the first and second distributed feedback regions but also in the modulation region and the amplification region. Thus, first and second light sources of coherent characteristics can be oscillated successively and stably with high power. As a result, high-stability multiple mode oscillation waves which are a key element for generation of a terahertz wave can be successively generated. In addition, a high-integration multiple distributed laser device can be realized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A multiple distributed feedback laser device comprising:
a substrate including a first distributed feedback region, a modulation region, a second distributed feedback region, and an amplification region;
an active layer continuously disposed on the substrate of the first distributed feedback region, the modulation region, the second distributed feedback region, and the amplification region;
a first diffraction grating disposed in the first distributed feedback region and coupled to the active layer in the first distributed feedback region;
a second diffraction grating disposed in the second distributed feedback region and coupled to the active layer in the second distributed feedback region;
a first micro heater configured to supply heat to the first diffraction grating; and
a second micro heater configured to supply heat to the second diffraction grating.

2. The multiple distributed feedback laser device of claim 1, further comprising:
a lower cladding layer disposed between the active layer and the substrate; and
an upper cladding layer disposed on the active layer,
wherein the lower cladding layer includes a compound semiconductor doped with a first-type dopant and the upper cladding layer includes a compound semiconductor doped with a second-type dopant.

3. The multiple distributed feedback laser device of claim 2, wherein
first laser current is supplied to the active layer in the first distributed feedback region to oscillate a first light source having a first wavelength,
second laser current is supplied to the active layer in the second distributed feedback region to oscillate a second light source having a second wavelength,
a reverse bias is applied to the upper cladding layer, the active layer, and the lower cladding layer in the modulation region to cause an electroabsorption phenomenon within the modulation region, and
amplification current is supplied to the active layer in the amplification region to amplify the first and second light sources supplied into the amplification region.

4. The multiple distributed feedback laser device of claim 2, wherein
the first diffraction grating is disposed inside one of the upper and lower cladding layers in the first distributed feedback region, and
the second diffraction grating is disposed inside one of the upper and lower cladding layers in the second distributed feedback region.

5. The multiple distributed feedback laser device of claim 2, further comprising:
a first separate hetero layer disposed between the lower cladding layer and the active layer and having a band gap wavelength less than that of the active layer; and
a second separate hetero layer disposed between the upper cladding layer and the active layer and having a band gap wavelength less than that of the active layer.

6. The multiple distributed feedback laser device of claim 1, further comprising:
a first electrode electrically connected to the upper cladding layer in the first distributed feedback region;
a second electrode electrically connected to the upper cladding layer in the second distributed feedback region;
a third electrode electrically connected to the upper cladding layer in the modulation region; and
a fourth electrode electrically connected to the upper cladding layer in the amplification region.

7. The multiple distributed feedback region of claim 6, wherein
the first and second micro heaters are disposed over the upper cladding layer, and
the first and second micro heaters are electrically insulated from the upper cladding layer.

8. The multiple distributed feedback laser device of claim 7, wherein the first micro heater overlaps the first electrode and the second micro heater overlaps the second electrode, the multiple distributed feedback laser device further comprising:

a first interlayer dielectric pattern disposed between the first electrode and the first micro heater; and a second interlayer dielectric pattern disposed between the second electrode and the second micro heater.

9. The multiple distributed feedback laser device of claim 7, wherein the first electrode overlaps a portion of the active layer in the first distributed feedback region and the first micro heater overlaps another portion of the active layer in the first distributed feedback region, and the second electrode overlaps a portion of the active layer in the second distributed feedback region and the second micro heater overlaps another portion of the active layer in the second distributed feedback region.

10. The multiple distributed feedback laser device of claim 9, wherein the first and second micro heaters are disposed at the same level as at least a portion of the first and second electrodes, on the basis of a top surface of the substrate.

11. The multiple distributed feedback laser device of claim 1, wherein the active layer in the amplification region has a uniform width, when viewed from the top.

12. The multiple distributed feedback laser device of claim 1, wherein the active layer in the amplification region has a taper shape, when viewed from the top.

13. The multiple distributed feedback laser device of claim 1, wherein the first micro heater and the second micro heater are independently controlled.

14. The multiple distributed feedback laser device of claim 1, wherein a refractive index of the first diffraction grating is changed by heat that the first micro heater supplies, and a refractive index of the second diffraction grating is changed by heat that the second micro heater supplies.

15. The multiple distributed feedback laser device of claim 1, wherein a temperature of the heat that the first micro heater supplies the first diffraction grating is different from a temperature of the heat that the second diffraction grating supplies the second diffraction grating.

16. The multiple distributed feedback laser device of claim 1, wherein at least one of the first and second diffraction gratings is a loss-coupled diffraction grating, a gain-coupled diffraction grating, an index coupled diffraction grating or a complex coupled diffraction grating.

17. The multiple distributed feedback laser device of claim 1, wherein the period of the first diffraction grating is equal to that of the second diffraction grating.

18. The multiple distributed feedback laser device of claim 1, wherein the period of the first diffraction grating is different from that of the second diffraction grating.

19. The multiple distributed feedback laser device of claim 1, wherein the active layer is formed to have a multiple quantum well structure.

20. The multiple distributed feedback laser device of claim 1, wherein the first and second diffraction gratings include a compound semiconductor doped with an n-type or p-type dopant.

* * * * *